(12) United States Patent
Grube et al.

(10) Patent No.: US 6,864,105 B2
(45) Date of Patent: Mar. 8, 2005

(54) METHOD OF MANUFACTURING A PROBE CARD

(75) Inventors: Gary W. Grube, Pleasanton, CA (US); Igor Y. Khandros, Orinda, CA (US); Benjamin N. Eldridge, Danville, CA (US); Gaetan L. Mathieu, Livermore, CA (US); Poya Lotfizadeh, San Francisco, CA (US); Chih-Chiang Tseng, Dublin, CA (US)

(73) Assignee: FormFactor, Inc., Livermore, CA (US)

( * ) Notice: Subject to any disclaimer, the term of this patent is extended or adjusted under 35 U.S.C. 154(b) by 228 days.

(21) Appl. No.: 10/087,081

(22) Filed: Mar. 1, 2002

(65) Prior Publication Data

US 2003/0025172 A1 Feb. 6, 2003

Related U.S. Application Data

(63) Continuation-in-part of application No. 09/903,798, filed on Jul. 11, 2001, now Pat. No. 6,729,019.

(51) Int. Cl.$^7$ ............................................... G01R 31/26
(52) U.S. Cl. ............................................ 438/14; 716/4
(58) Field of Search .......................... 716/4, 1; 438/14; 324/724, 754, 757, 758; 702/117

(56) References Cited

U.S. PATENT DOCUMENTS

| | | |
|---|---|---|
| 3,849,728 A | 11/1974 | Evans |
| 4,480,223 A | 10/1984 | Aigo |
| 4,567,432 A | 1/1986 | Buol et al. |
| 4,837,622 A | 6/1989 | Whann et al. |
| 4,899,099 A | 2/1990 | Mendenhall et al. |
| 4,983,907 A | 1/1991 | Crowley |
| 4,994,735 A | 2/1991 | Leedy |
| 5,090,118 A | 2/1992 | Kwon et al. |
| 5,103,557 A | 4/1992 | Leedy |
| 5,148,103 A | 9/1992 | Pasiecznik, Jr. |
| 5,162,728 A | 11/1992 | Huppenthal |
| 5,177,439 A | 1/1993 | Liu et al. |
| 5,185,502 A | 2/1993 | Shepherd et al. |
| 5,191,708 A | 3/1993 | Kasukabe et al. |
| 5,225,777 A | 7/1993 | Bross et al. |
| 5,308,443 A | 5/1994 | Sugihara |
| 5,399,982 A | 3/1995 | Driller et al. |
| 5,513,430 A * | 5/1996 | Yanof et al. .................. 29/846 |
| 5,521,518 A | 5/1996 | Higgins |
| 5,534,784 A | 7/1996 | Lum et al. |

(List continued on next page.)

FOREIGN PATENT DOCUMENTS

| | | |
|---|---|---|
| EP | 802419 A2 | 10/1997 |
| JP | 05-029406 | 2/1993 |
| JP | 06-050990 | 2/1994 |
| JP | 08-015318 | 1/1996 |
| WO | WO 98/52224 | 11/1998 |
| WO | WO 00/33096 | 6/2000 |
| WO | WO 00/75677 | 12/2000 |
| WO | WO 01/09623 A1 | 2/2001 |

OTHER PUBLICATIONS

Leung et al., "Active Substrate Membrane Probe Card," Center For Integrated Systems Stanford University (Oct. 12, 1995).
U.S. Appl. No. 10/823,437, filed Apr. 12, 2004, Grube et al.

*Primary Examiner*—Stacy A. Whitmore
(74) *Attorney, Agent, or Firm*—N. Kenneth Burraston

(57) ABSTRACT

A method of designing and manufacturing a probe card assembly includes prefabricating one or more elements of the probe card assembly to one or more predefined designs. Thereafter, design data regarding a newly designed semiconductor device is received along with data describing the tester and testing algorithms to be used to test the semiconductor device. Using the received data, one or more of the prefabricated elements is selected. Again using the received data, one or more of the selected prefabricated elements is customized. The probe card assembly is then built using the selected and customized elements.

25 Claims, 29 Drawing Sheets

U.S. PATENT DOCUMENTS

| | | | |
|---|---|---|---|
| 5,701,666 A | | 12/1997 | DeHaven et al. |
| 5,736,850 A | | 4/1998 | Legal |
| 5,806,181 A | | 9/1998 | Khandros et al. |
| 5,821,763 A | | 10/1998 | Beaman et al. |
| 5,828,226 A | | 10/1998 | Higgins et al. |
| 5,974,662 A | | 11/1999 | Eldridge et al. |
| 6,014,032 A | | 1/2000 | Maddix et al. |
| 6,043,563 A | * | 3/2000 | Eldridge et al. ............ 257/784 |
| 6,050,829 A | * | 4/2000 | Eldridge et al. ............ 439/67 |
| 6,133,744 A | * | 10/2000 | Yojima et al. ............... 324/754 |
| 6,160,412 A | * | 12/2000 | Martel et al. ............... 324/761 |
| 6,174,744 B1 | | 1/2001 | Watanabe et al. |
| 6,184,576 B1 | | 2/2001 | Jones et al. |
| 6,188,231 B1 | | 2/2001 | Palagonia |
| 6,215,320 B1 | | 4/2001 | Parrish |
| 6,289,583 B1 | | 9/2001 | Belmont et al. |
| 6,538,461 B2 | * | 3/2003 | Novak et al. ............... 324/754 |

* cited by examiner

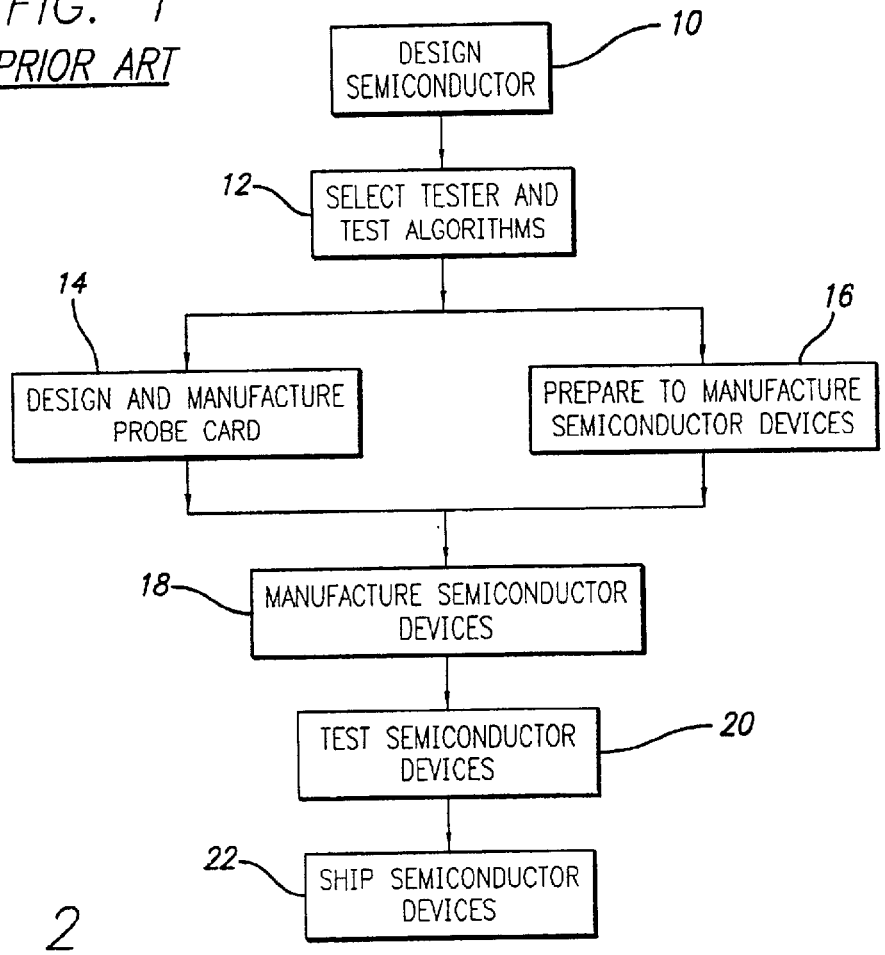
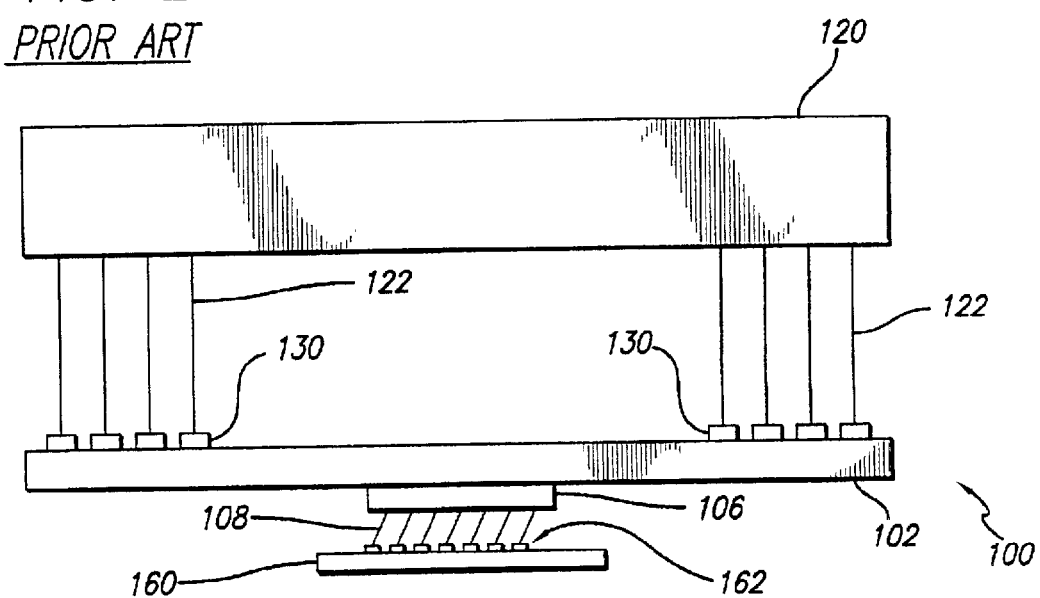

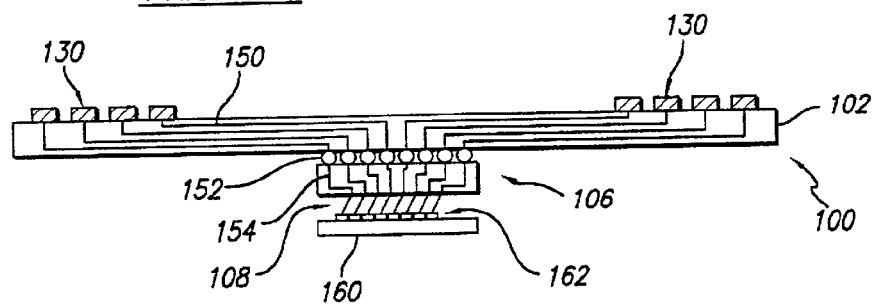
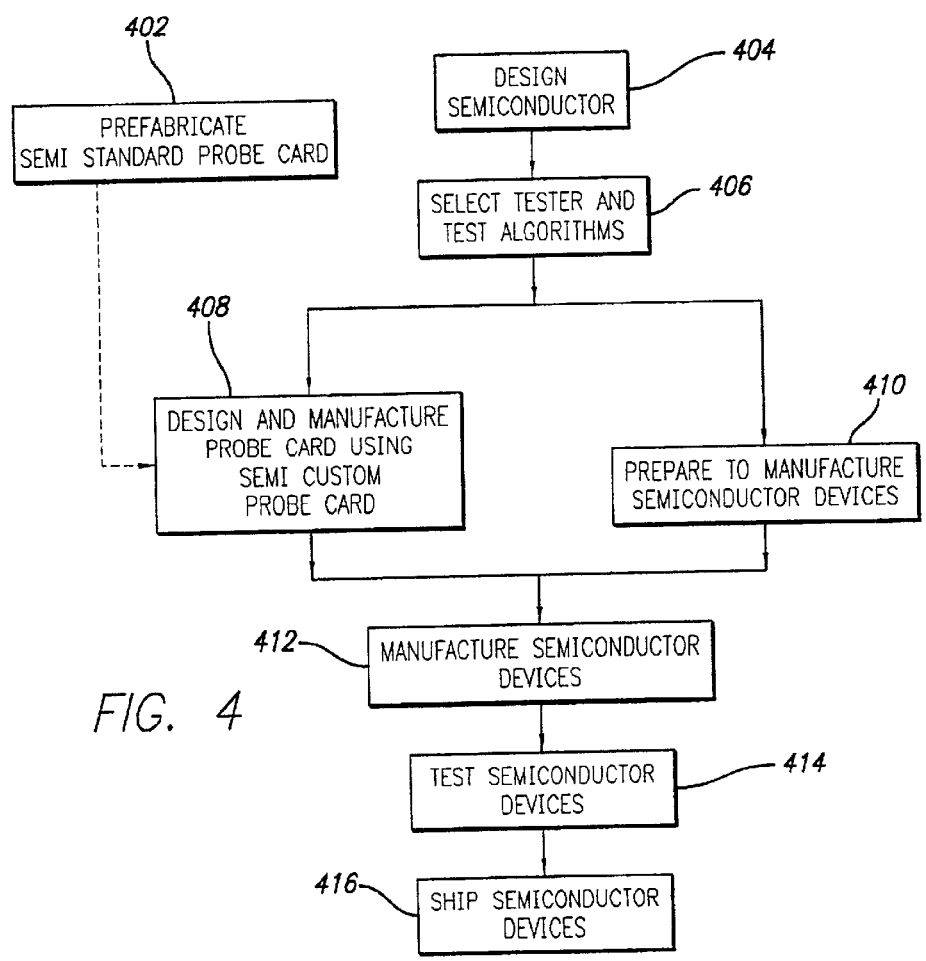

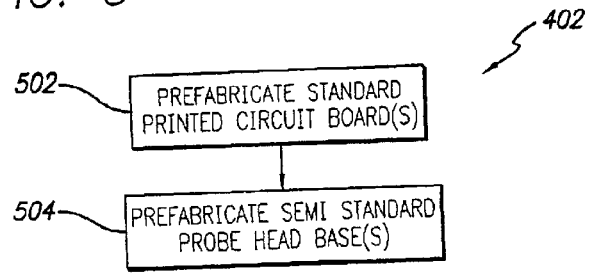
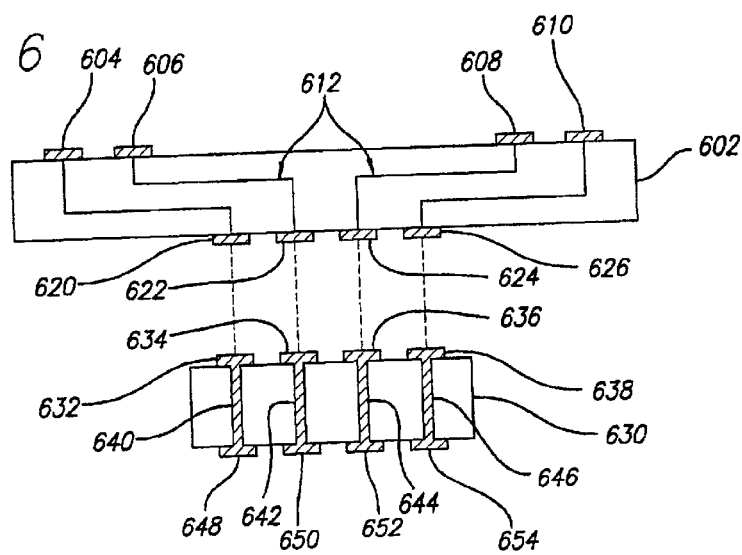
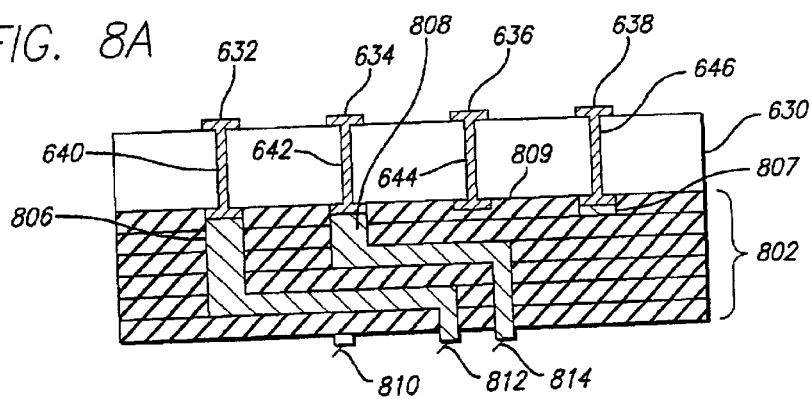

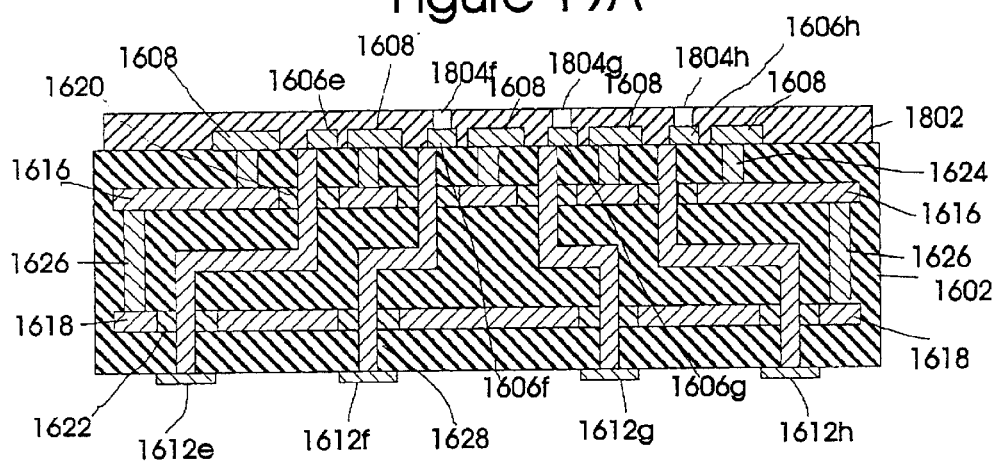
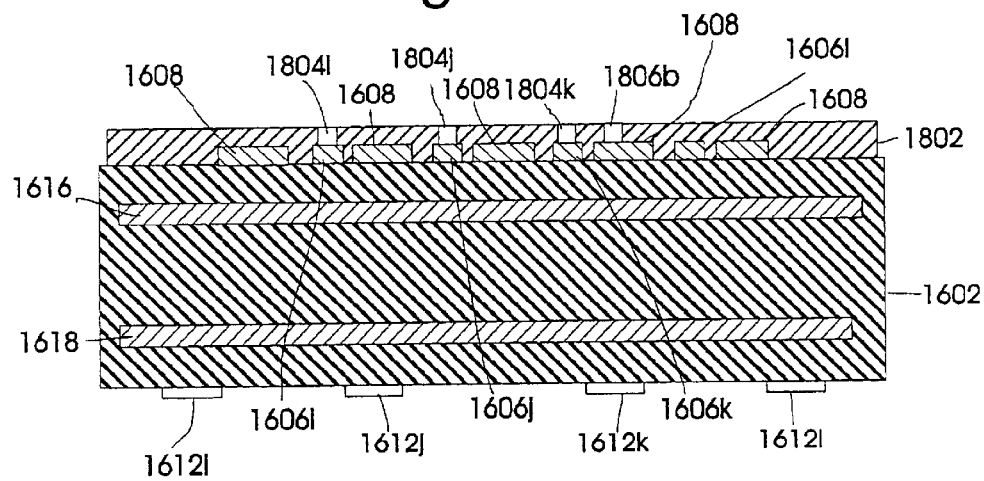

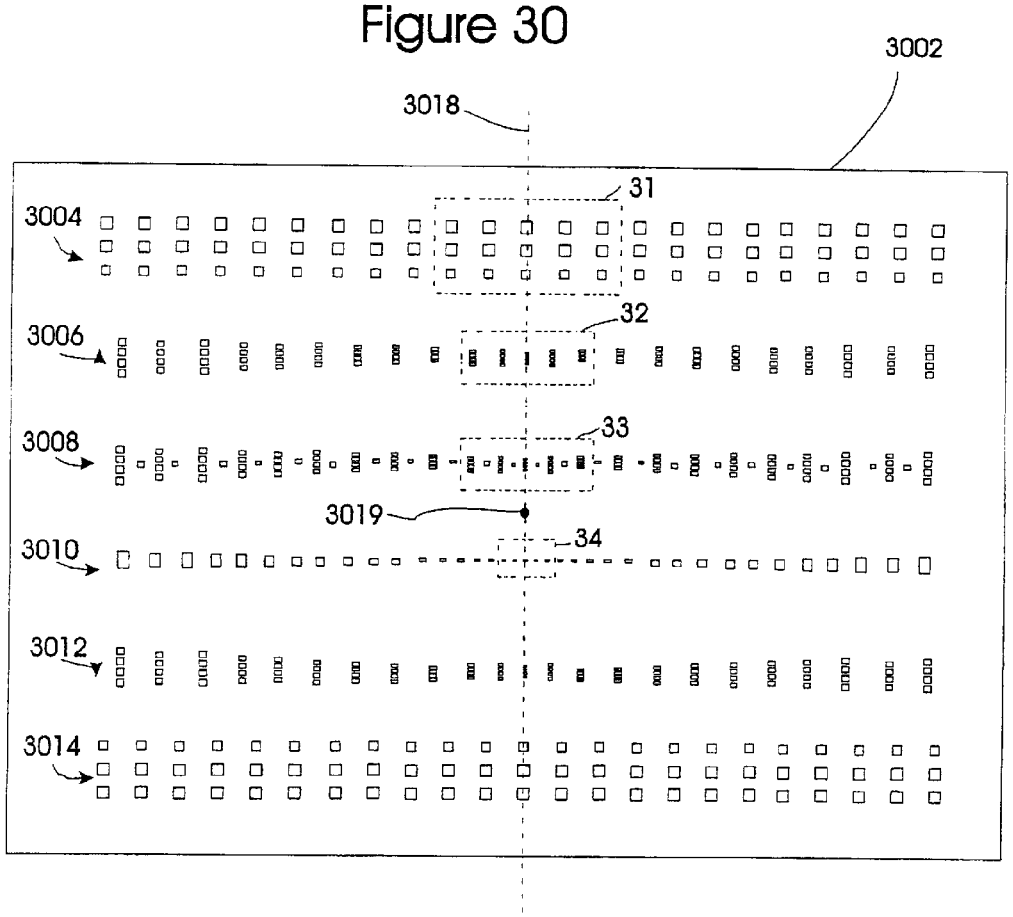

METHOD OF MANUFACTURING A PROBE CARD

CROSS REFERENCE TO RELATED APPLICATIONS

This application is a continuation-in-part of U.S. application Ser. No. 09/903,798, filed Jul. 11, 2001 now U.S. Pat. No. 6,729,019.

BACKGROUND OF THE INVENTION

1. Field of the Invention

The present invention relates generally to an improved method of designing and manufacturing a probe card assembly and more specifically to use of prefabricated elements to speed design and manufacture of the probe card assembly.

2. General Background and Related Art

FIG. 1 illustrates a simplified overview of a typical flow of common activities involved in designing and manufacturing a semiconductor device, such as a microelectronic "chip." Initially, the semiconductor device is designed 10, and a tester and testing algorithms are selected and/or designed 12 for testing the semiconductor device. Using data regarding the semiconductor device design, the tester, and/or the test algorithms, a probe card for testing the semiconductor device is then custom designed 14. Usually concurrently, preparations are made to begin manufacturing the semiconductor device in commercial quantities 16. Once the probe card is designed and manufactured and preparations to manufacture the semiconductor device are completed, semiconductor devices are manufactured in commercial quantities 18. As the semiconductor devices are manufactured, each is tested 20, and good semiconductor devices are shipped to customers 22.

FIG. 2 illustrates a simplified block diagram of a typical test arrangement for testing the semiconductor device at step 20. A tester 120 generates test signals to be input into a semiconductor device under test 160. The tester 120 then monitors response signals generated by the semiconductor device under test 160. The tester 120 communicates with the semiconductor device under test 160 via a probe card assembly 100.

As shown in FIG. 2 and FIG. 3 (which illustrates a cross-section of the probe card assembly 100), a typical probe card assembly 100 includes a printed circuit board 102, which usually includes a number of tester contacts 130 for connecting to the semiconductor tester 120 (not shown in FIG. 3) via connections 122 (not shown in FIG. 3). A probe head 106 is attached to the printed circuit board 102. The probe head 106 includes probes 108 for contacting test points 162 on the semiconductor devices being tested 160.

As shown in FIG. 3, electrical traces 150 on or within the printed circuit board 102 connect the tester contacts 130 to the probe head assembly 106 and ultimately to probes 108. Thus, electrical paths between inputs and outputs (not shown) on the semiconductor tester 120, on one hand, and the probes 108, on the other hand, are established. As also shown in FIG. 3, the probe head 106 is typically connected to the printed circuit board 102 via connections 152, which may be, for example, solder ball connections or contact pins soldered to the printed circuit board 102, the probe head 156, or both. Traces 150 on or within the printed circuit board 102 connect the tester contacts 130 to the connections 152, and traces 154 on or within the probe head 106 connect the connections 152 to the probes 108.

Thus, in essence, the probe card assembly 100 acts as an interface, providing numerous electrical paths for test and response signals between the tester 120 and the device under test 160. As is known, a probe card assembly 100 must be custom designed to meet the specific test needs of the device under test 160 and the test specifications of the tester 120. For example, the probes 108 of the probe card assembly 100 must be custom positioned to match the pattern of test contacts 162 on the device under test 160, and the probe card assembly 100 must be custom designed such that each probe 108 is electrically connected through tester contacts 130 to the proper tester connection 122. For this reason, as shown in FIG. 1, the design and manufacture of the probe card assembly 14 does not begin until the semiconductor device has been designed 10 and a tester and/or testing algorithms selected 12.

As is known, semiconductor devices cannot be shipped to customers 22 until they are tested 20, and the probe card assembly is a necessary element of the test system. Thus, even if the step of preparing to manufacture the semiconductor devices 16 has been completed, manufacture, testing, and shipping of the semiconductor devices 18, 20, 22 cannot proceed until design and manufacture of the probe card 14 has been completed. Thus, if the design and manufacture of the probe card 14 takes longer than the preparations to manufacture the semiconductor devices 16, which is increasingly the case, the extra time taken in designing and manufacturing the probe card lengthens the entire process shown in FIG. 1 and delays the final step of shipping semiconductor devices to customers 22. Thus, a way of shortening the step of designing and manufacturing a probe card assembly is needed.

SUMMARY

The invention relates generally to methods of making probe card assemblies, which are used to test semiconductor devices. One or more elements of the probe card assembly is prefabricated to one or more predefined designs. Thereafter, design data regarding a newly designed semiconductor device is received along with data describing the tester and testing algorithms to be used to test the semiconductor device. Using the received data, one or more of the prefabricated elements is selected. Again using the received data, one or more of the selected prefabricated elements is customized. The probe card assembly is then built using the selected and customized elements. The use of prefabricated elements shortens the process of designing and manufacturing a probe card assembly.

BRIEF DESCRIPTION OF THE DRAWINGS

FIG. 1 illustrates an overview of a typical flow of common activities involved in designing and manufacturing a semiconductor device.

FIG. 2 illustrates a simplified block diagram of a typical testing system used to test semiconductor devices.

FIG. 3 illustrates a cross section of a typical probe card assembly and a semiconductor device under test.

FIG. 4 illustrates an exemplary embodiment of the present invention.

FIG. 5 illustrates exemplary steps for performing step 402 of FIG. 4.

FIG. 6 illustrates an exemplary prefabricated printed circuit board and probe head base.

FIG. 8A illustrates an exemplary manner of adding customization to a probe head base.

FIGS. 19A and 19B are cross-sectional views of FIG. 18.

FIG. 30 illustrates an exemplary prefabricated probe head base.

DETAILED DESCRIPTION

Figure 7:
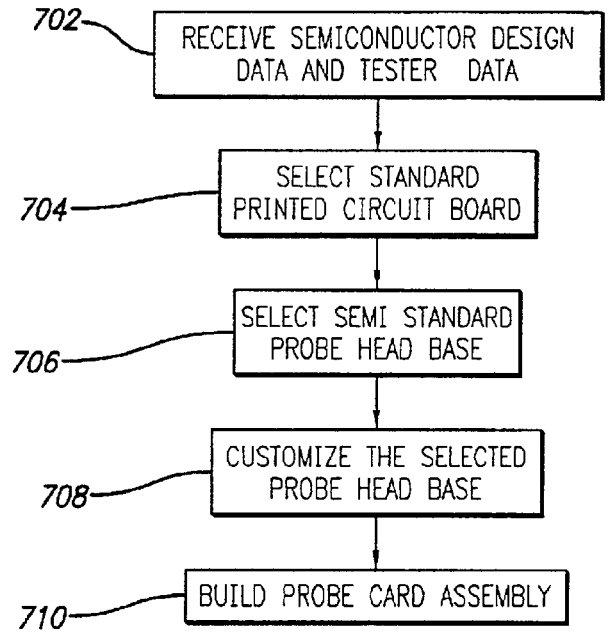
FIG. 7 illustrates exemplary steps for performing step 408 of FIG. 4.

The present invention is directed to an improved method of designing and manufacturing a probe card assembly. The following specification describes several exemplary embodiments and applications of the invention. The invention, however, is not limited to these exemplary embodiments and applications or to the manner in which the exemplary embodiments and applications operate or are described herein.

FIG. 4 illustrates an exemplary application of the principles of the present invention to a process for designing, manufacturing, and shipping a semiconductor device. As shown, an initial step is designing a new semiconductor device 404, such as a microelectronic "chip." A tester and/or testing algorithms for testing the semiconductor device must also be selected and/or designed 406. Separate and apart from these two steps, and preferably prior to these steps, semistandard probe card assemblies are premanufactured 402. Once the semiconductor design 404 is complete and the tester and/or testing algorithms have been selected 406, data regarding the semiconductor design and the tester and/or testing algorithm are used to add customization to the prefabricated semistandard probe card assembly at step 408. Use of a premanufactured, semistandard probe card assembly simplifies and shortens the process of designing and manufacturing the probe card assembly 408. Because the step of designing and manufacturing the probe card assembly 408 is a critical step in the overall process illustrated in FIG. 4, shortening this step may shorten the overall process of FIG. 4.

There are many ways to prefabricate semistandard probe card assemblies 402 for later customization 408 to a specific semiconductor device design and tester and/or testing algorithm. FIG. 5 illustrates an exemplary embodiment of the step of prefabricating semistandard probe card assemblies 402, and FIG. 7 illustrates an exemplary embodiment of step of designing and manufacturing a probe card assembly using a semistandard probe card assembly 408.

At step 502 in FIG. 5, standard printed circuit boards are premanufactured to one or more standard designs. The designs are "standard" in the sense that they are not driven by any specific semiconductor design or test algorithm. The printed circuit boards are "premanufactured" in the sense that they may be, and preferably are, designed and manufactured prior to completion of the semiconductor design step 404 and step of selecting a tester and/or testing algorithm 406 of FIG. 4. Of course, however, the standard designs may correspond generally with common semiconductor designs or design methodologies as well as common tester configurations and test algorithms or methodologies.

The present invention is not dependent on the use of any particular type of printed circuit board. Shown in FIG. 6 is a cross section view of an exemplary printed circuit board 602 that may be used with the invention. As can be seen, printed circuit board 602 includes tester contacts 604, 606, 608, 610 for making electrical connections with a tester (not shown in FIG. 6). Printed circuit board 602 may be generally circular in shape and have numerous tester contacts; only four tester contacts 604, 606, 608, 610 are shown for simplicity. Electrical connections 612 connect tester contacts 604, 606, 608, 610 to contacts 620, 622, 624, and 626. It should be understood that connections 612 are illustrated schematically and may take any of many physical forms. For example, conductive traces located on the top side (from the perspective of FIG. 6) or within the printed circuit board 602 may connect tester contacts 604, 606, 608, 610 to vias (not shown) that extend through the printed circuit board to contacts 620, 622, 624, 626. Alternatively, printed circuit board 602 may include a hole or cavity (into which the probe head 630 may fit), and contacts 620, 622, 624, 626 may be located within the hole or cavity. Another nonexclusive example of a printed circuit board that may be used is described in copending U.S. patent application Ser. No. 09/060,308, filed Apr. 14, 1998, which is incorporated herein in its entirety by reference. It should be noted that the printed circuit board may be made out of any material or combination of materials suitable for creating a platform for supporting tester contacts 604, 606, 608, 610 and contacts 620, 622, 624, 626 with electrical connections there between.

There is no limit to the criteria that may be used to establish the standard designs for the printed circuit board. Referring again to FIG. 6, one nonexclusive example of a criterion is the pattern of the tester contacts 604, 606, 608, 610. That is, printed circuit boards 602 may be premanufactured to have particular patterns of tester contacts 604, 606, 608, 610, which may, for example, be readily capable of interfacing with known testers (not shown in FIG. 6). Another nonexclusive example of a criterion for establishing a standard design is the pattern of contacts 620, 622, 624, 626, which may interface with a probe head 630. Again, the printed circuit boards 602 may be premanufactured to have any one of a number of predetermined patterns of contacts 620, 622, 624, 626. Yet another nonexclusive example of a standard design criterion is a pattern of wiring 612 connecting tester contacts 604, 606, 608, 610 to contacts 620, 622, 624, 626. Again, the printed circuit boards 602 may be premanufactured to have any one of a number of predetermined patterns of such wiring 612. More simply, the printed circuit boards 602 may be premanufactured to one of several predetermined sizes. Of course, the standard designs may be based on any combination of the above mentioned exemplary criteria, or any other suitable criteria.

Referring back to FIG. 5, at step 504, semistandard probe head bases are premanufactured to one or more predetermined, semistandard designs. The designs are "semistandard" in the sense that their initial design and manufacture are not driven by any particular semiconductor device design or test algorithm. They are, however, designed to be later customized to a particular semiconductor device design, tester, and/or test algorithm. The probe head bases are "premanufactured" in the sense that, initially, they may be, and preferably are, designed and manufactured prior to completion of the semiconductor device design step 404 and step of selecting a tester and/or testing algorithm 406 of FIG. 4. Of course, however, the semistandard designs may correspond generally with common semiconductor device designs or design methodologies as well as common tester configurations and test algorithms or methodologies.

The present invention is not dependent on the use of any particular type of probe head. Shown in FIG. 6 is a cross section of an exemplary probe head base 630 that may be used with the invention. In the exemplary probe head base 630 illustrated in FIG. 6, probe head base 630 includes contacts 632, 634, 636, 638 for making electrical connections to contacts 620, 622, 624, 626 on printed circuit board 602. Vias 640, 642, 644, 646 provide electrical connections through the probe head base 630 to contacts 648, 650, 652, 654. These vias form wiring paths, or in other words a wiring pattern. As discussed below, a customized pattern of probes (not shown) and customized interconnections between contacts 648, 650, 652, 654 may be added to the bottom surface (from the perspective of FIG. 6) of the probe head base 630.

The exemplary probe head base 630 illustrated in FIG. 6 is preferably made of a solid or layered ceramic material. It should be noted, however, that the probe head base may be made out of any material or combination of materials suitable for creating a platform for supporting contacts 632, 634, 636, 638 and contacts 648, 650, 652, 654 with electrical connections there between. It should also be noted that the vias 640, 642, 644, 646 may be fashioned or replaced with other connectors that allow the contacts on one surface of probe head base 630 to be disposed in a pattern that is different than the contacts on the other surface. One nonexclusive alternative silicon based probe head that may be used with the present invention is disclosed in U.S. patent application Ser. No. 09/042,606, filed Mar. 16, 1998, which is incorporated herein by reference in its entirety.

As with the printed circuit board, there is no limit to the criteria establishing the predetermined, semistandard designs. Referring again to FIG. 6, one nonexclusive example of a criterion is the pattern of the contacts 632, 634, 636, 638 for contacting the printed circuit board 602. That is, probe head bases 606 may be premanufactured to have particular patterns of such contacts, which may, for example, be designed to match a pattern of contacts 620, 622, 624, 626 on one of the premanufactured printed circuit boards 602, as shown in FIG. 6. Another nonexclusive example of a criterion establishing an initial design of the probe head bases is the pattern of contacts 648, 650, 652, 654 that will connect to probes (not shown in FIG. 6). Again, the probe head bases 630 may be premanufactured to have any one of a number of predetermined patterns of such contacts. Yet another nonexclusive example of a standard design criterion is a pattern of vias or wiring 640, 642, 644, 646 connecting the contacts on one side of the probe head bases 630 to the contacts on the other side. The probe head bases 630 may be premanufactured to have any one of a number of predetermined patterns of such vias or wiring. As with the printed circuit board 602, the probe head bases 630 may be premanufactured to one of several predetermined sizes. Of course, however the semistandard designs may be based on any combination of the above mentioned exemplary criteria, or any other suitable criteria.

Referring now to FIG. 7 (which illustrates an exemplary process for carrying out step 408 of FIG. 8), data regarding the design of the specific semiconductor device to be tested is received as is data regarding the tester and test algorithms to be used 702. The data may include (without limitation) such things as the locations of test points on the semiconductor device, information regarding test signals to be input into selected ones of the test points, information regarding responses expected at ones of the test points, and/or other information regarding testing of the semiconductor device. Using the semiconductor device design data, tester, and/or test algorithm data received at step 702, a prefabricated, standard printed circuit board and a semistandard probe head base are selected 704, 706. Again using the semiconductor device design data, tester, and/or test algorithm data received at step 702, the selected probe head base is customized to meet the specific test needs of the semiconductor device design, the tester, and/or the test algorithm 708. The probe card assembly is then assembled by, among other things, bringing the customized probe head base together with the selected printed circuit board 710. It should be noted that all of the steps illustrated in FIG. 7 and described above need not necessarily be performed in the order shown. For example, the probe head base and the standard printed circuit board may be brought together before the probe head base is customized, and thereafter, the probe head base is customized.

FIG. 8A illustrates an exemplary manner in which a probe head base may be customized. The probe head base 630 illustrated in FIG. 8A is similar to the probe head base 630 discussed above with respect to FIG. 6. It is preferably made of a nonconductive material, such as ceramic, with a plurality of vias 640, 642, 644, 646 (to simplify the discussion only four are shown) that electrically connect a pattern of contacts 632, 634, 636, 638 (again only four are shown to simplify the discussion) on one side of the probe head base 630 to a pattern of similar contacts (only four shown) on the other side 809 of the probe head base 830.

In the example illustrated in FIG. 8A, customization is added to side 809 of the probe head 630 in the form of patterned layers of a conductive material and an insulating material 802. A custom pattern of probes 810, 812, 814 (only three are shown for simplicity) are formed on the outermost layer. This pattern of probes is customized to match a pattern of test contacts on the semiconductor device to be tested (not shown in FIG. 8A). The customization layers 802 define conductive paths that form signal paths from a via 640, 642, 644, 646 to a probe 810, 812, 814. (It should be noted that the size of the customization layers with respect to the probe base is not necessarily to scale.) In the specific example shown in FIG. 8A, conductive path 806 connects via 640 to probe 812. Similarly, conductive path 808 connects via 642 to probe 814. Conductive path 807, which initially extends vertically from via 646 but then turns into the page so as not be seen in the view shown in FIG. 8A, connects via 646 with probe 810. (Note that via 810 is located into the page with respect to vias 812, 814.) Via 644 is not used and therefore is not connected to a probe. In this manner, custom positioned probes 810, 812, 814 are added to the probe head base 630 to correspond to specific test points on the semiconductor devices to be tested, and custom layers 802 provide custom wiring paths from vias 640, 642, 644, 646 to the probes.

It should be noted that any type of probe suitable for contacting test points on a semiconductor device under test may be used with the present invention. Typically, a probe will include a contact pad formed on or within an outer layer of the customization layers 802, and an elongate, conductive structure formed on the contact pad. Examples of an elongate, conductive structure include, but are not limited to, needle probes and cobra-style probes. Another example of an elongate, conductive structure that may be used are resilient spring-like structures. Examples of such structures are described in U.S. Pat. No. 5,476,211, U.S. Pat. No. 5,917,707, and U.S. Pat. No. 6,184,053 B1, each of which is incorporated herein by reference in its entirety. Of course, the probes may be nothing more than simple contact pads, which may be particularly useful if the test points on the semiconductor are bumps, elongate spring-like connectors, or other raised or extended test points. Other suitable "probes" that may be particularly useful with raised or extended test points on the semiconductor device include conductive recesses or sockets formed in outer layers of the customization layers 802. The term "probes," as used herein, is intended to include all of the foregoing structures and similar structures.

The exemplary customization layers 802 illustrated in FIG. 8A may be formed layer-by-layer on the probe head base 630 using standard lithographic techniques well understood in the semiconductor field, including laser patterning techniques. Alternatively, the customization layers 802 may be formed separately from the probe head base 630 and then joined to the probe head base. Of course, the customization layers 802 may also be formed using a combination of the foregoing. It is also within the scope of the invention that the customization layers 802 may be formed from one or more prefabricated semicustom layers that are selected and joined to form the customization layers 802.

Figure 8B:
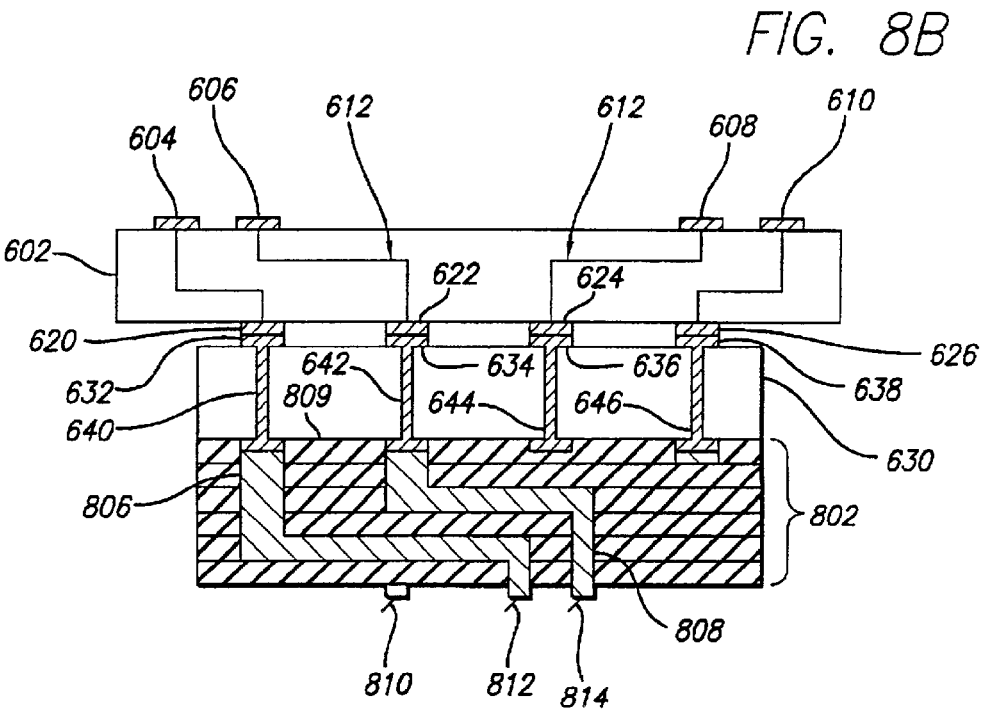
FIG. 8B illustrates a customized probe head base joined to a printed circuit board.

Once the probe head base 630 has been customized, it is joined to the selected printed circuit board 602 as shown in FIG. 8B. As should be apparent, a custom pattern of probes 810, 812, 814 (three shown of many) has been formed, and tester contacts 604, 606, 608, 610 (four shown of many) have been custom connected to the probes. In the example shown in FIG. 8B, tester contact 604 has been connected to probe 812; tester contact 606 has been connected to probe 814; tester contact 608 is not used and has not been connected to a probe; and tester contact 610 has been connected to probe 810.

Figure 9A:
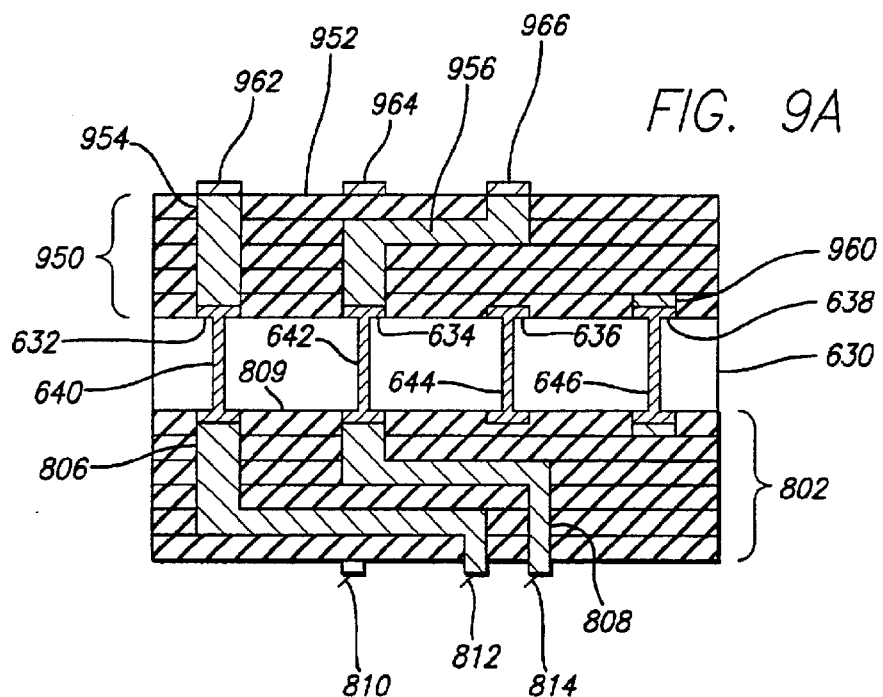
FIG. 9A illustrates customization applied to both sides of a probe head base.
Figure 9B:
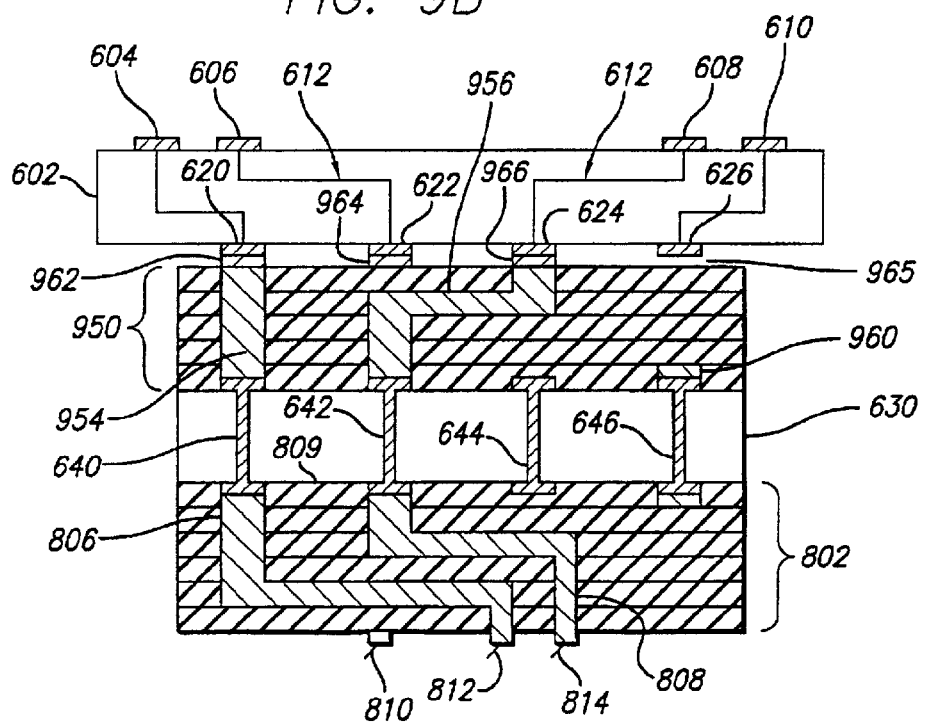
FIG. 9B illustrates a customized probe head base joined to a printed circuit board.

As shown in FIGS. 9A and 9B, customization may be formed on both sides of the probe head base 630. As shown, the connections between vias 640, 642, 644, 646 and corresponding contact pads on printed circuit board 602 are altered or customized from the standard configuration by customization layers 950. Namely, although contact pad 620 on printed circuit board 602 remains connected to via 640 through conductive path 954, contact 622 on printed circuit board 602 is now connected to via 646 through conductive path 960 (much of which extends into the page in the views shown in FIGS. 9A and 9B), and contact 624 is connected to via 642 through conductive path 956. In this example, contact 626 and via 644 are not used, and therefore are not connected.

Although in the exemplary processes illustrated in FIGS. 5 through 9B customization is applied only to the probe head while the printed circuit board is fully standard, customization may alternatively or additionally be applied to the printed circuit board. For example, some or all of the exemplary customization layers 950 illustrated in FIGS. 9A and 9B could be applied to the lower surface (from the perspective of FIGS. 9A and 9B) of the printed circuit board. Likewise, customization layers (not shown) could be applied to the upper surface of the printed circuit board 602 on which are located tester contacts 604, 606, 608, 610 in order to customize the connections between the tester (not shown) and the printed circuit board. Indeed, it is within the scope of the invention to prefabricate in one or more fully standard or semistandard configurations any one or more of the surfaces of the printed circuit board 602 and the probe head base 630, and later customize the semistandard surfaces.

Figure 10A:
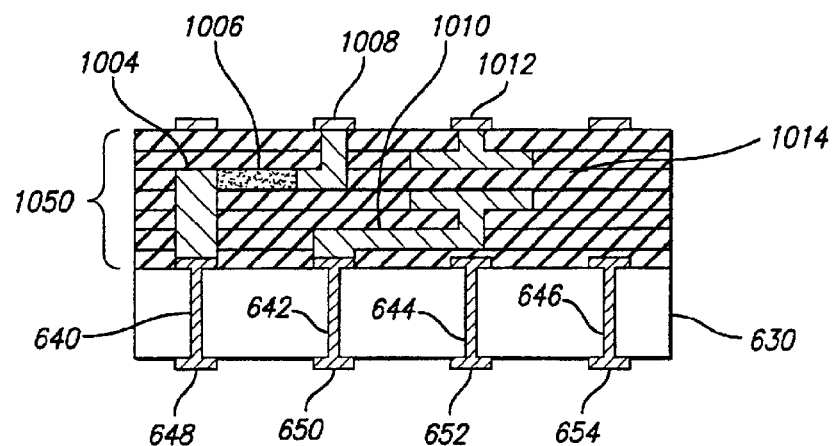
FIG. 10A illustrates forming circuit elements within customization layers.

Circuit elements may be optionally formed within the customization layers discussed above. FIG. 10A illustrates an exemplary resistor 1006 and an exemplary capacitor 1014 formed within customization layers 1050. In the example shown in FIG. 10A, and in accordance with the above discussion with regard to FIGS. 8A through 9B, a conductive path 1004 is formed between via 640 in probe head base 630 and terminal 1008. Resistive material 1006 embedded within the conductive path 1004 adds a resistor to the path. The resistive material 1006 may be formed within customization layers 1050 using standard lithographic techniques known to those in the semiconductor field, including laser patterning techniques. A similar conductive path 1010 is formed between via 642 and terminal 1012. As shown in FIG. 10A, a capacitor 1014 is formed along the conductive path 1010. In like manner, any number and type of circuit elements may be embedded within customization layers 1050. Indeed, it is within the scope of the invention to form a microelectronic circuit, such as an integrated circuit, within the customization layers using standard lithographic techniques used to make semiconductor devices, including laser patterning techniques. Thus, circuit elements such as microprocessors, memories, and the like can also be built into the customization layers 1050.

Figure 10B:
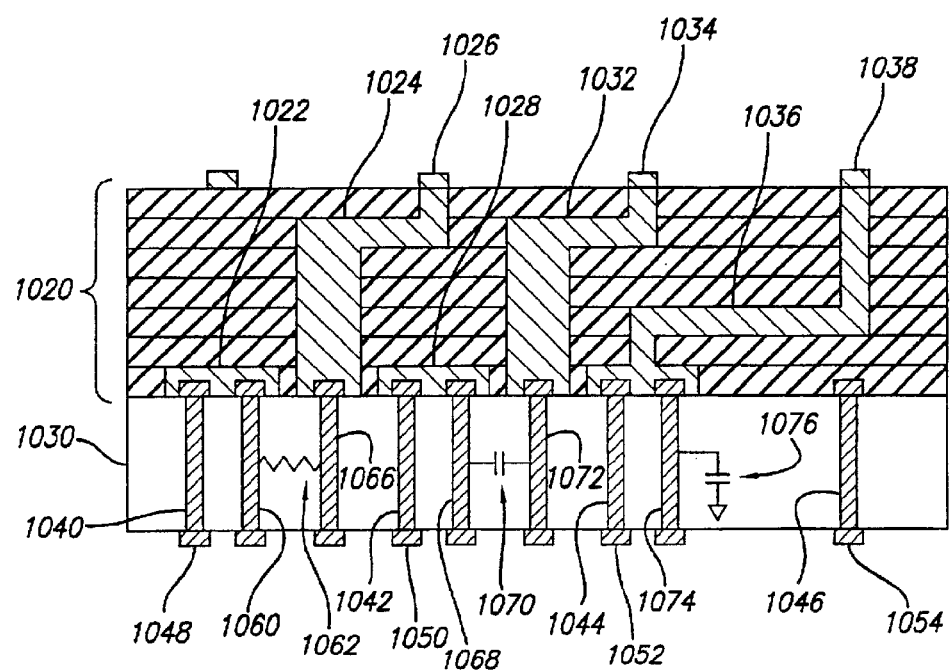
FIG. 10B illustrates selectively adding circuit elements to the customization portion.

FIG. 10B illustrates an alternative way of incorporating select circuit elements into the customization. Like probe head base 630, exemplary probe head base 1030 includes vias 1040, 1042, 1044, 1046 that provide conductive paths from one side of the probe head base 1030 to the other. Unlike probe head base 630, however, probe head base 1030 includes embedded circuit elements. As shown in this example, probe head base 1030 includes an embedded resistor 1062, capacitor 1070, and capacitor 1076. Vias 1060, 1066, 1068, 1072, 1074 provide signal paths to the embedded circuit elements. Custom layers 1020 selectively include the embedded circuit elements. In the example shown in FIG. 10B, resistor 1062 has been included in custom conductive path 1022, 1024 between via 1040 and contact 1026; series capacitor 1070 has been included in custom conductive path 1028, 1032 between via 1042 and contact 1034; and grounded capacitor 1076 has been included in custom conductive path 1036 between via 1044 and contact 1038.

Figure 11A:
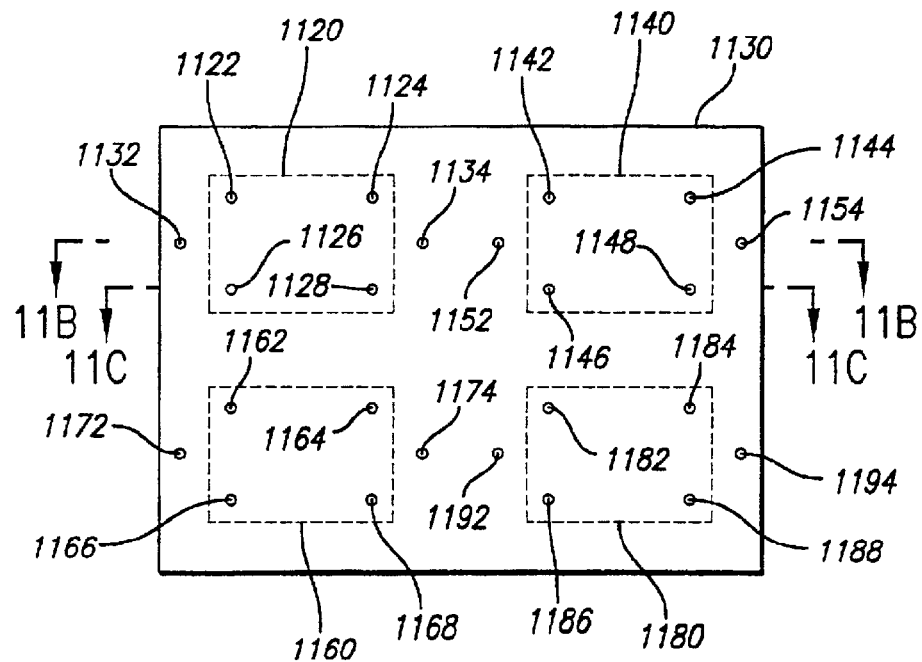
FIGS. 11A, 11B, and 11C illustrate an exemplary probe head base with embedded decoupling planelets.
Figure 11B:
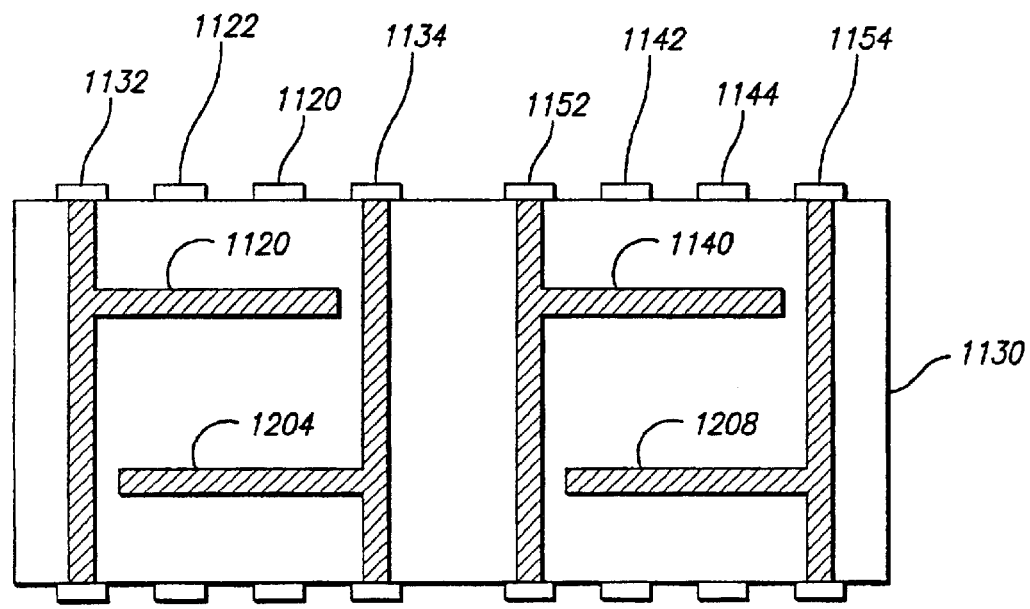
Figure 11C:
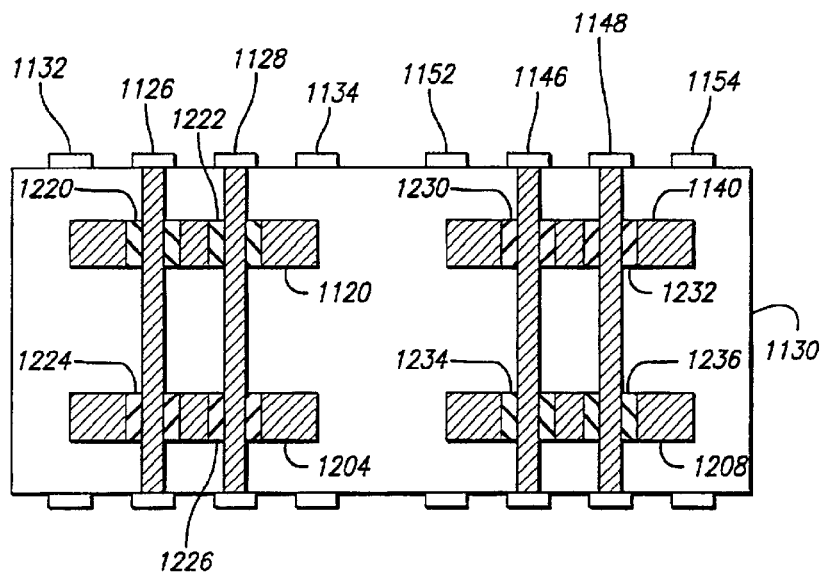
Figure 12:
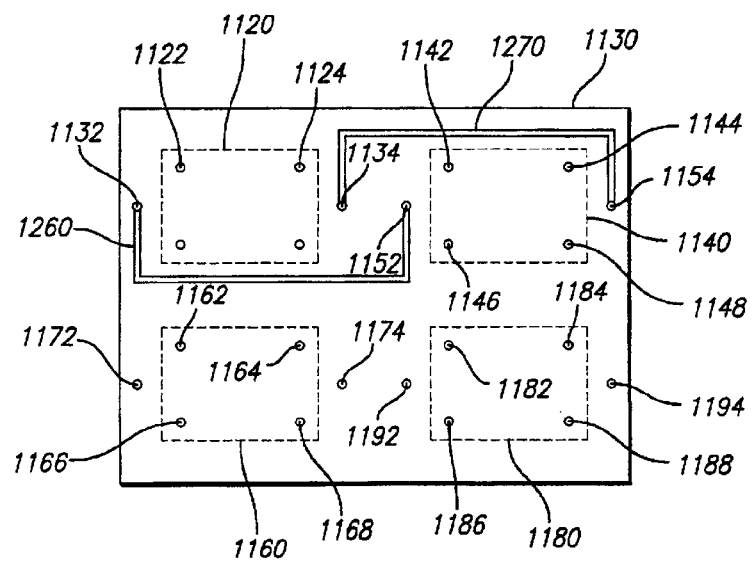
FIG. 12 illustrates selective connection of the planelets in FIGS. 11A, 11B, 11C to form larger decoupling planes.

FIGS. 11A through 12 illustrate a way of including customized decoupling capacitance in a probe card assembly. As shown in FIG. 11A, an exemplary probe head base 1130 includes a number of embedded parallel power and ground planelets for decoupling the power supply (not shown). As discussed below, the planelets can be selectively connected to form larger decoupling planes.

FIG. 11A illustrates a top view of an exemplary semistandard probe head 1130 with embedded power and ground planelets. In this example (and as illustrated in FIGS. 11B and 11C), the power planelets 1120, 1140, 1160, and 1180 and the ground planelets 1204, 1208 (only two are shown) are embedded within the probe head 1130, and the power planelets are located above the ground planelets from the perspective of FIG. 11A. For these reasons, only the power planelets 1120, 1140, 1160, 1180 are shown in FIG. 11A, and they are shown as dashed lines (indicating that they are embedded).

A number of signal vias (in this example four) pass through each set of parallel power and ground planelets. (For example, signal vias 1122, 1124, 1126, 1128 pass through power plane 1120 and ground plane 1204.) FIG. 11C is a cross-section of the probe head 1130 taken through two of the four vias that pass through each of two parallel sets of power and ground planelets. As shown in FIG. 11C, signal vias 1126, 1128 provide signal paths from one side of probe head 1130 to the other, and in doing so, both signal vias pass through a parallel set of power and ground planelets 1120, 1204. Insulated hole 1220 in power planelet 1120 allows signal via 1126 to pass through power planelet 1120, while insulating the signal via 1126 from the power planelet 1120. Insulated hole 1224 in ground planelet 1204 similarly allows signal via 1126 to pass through ground planelet 1204, while insulating signal via 1126 from ground planelet 1204. Similar insulated holes 1222, 1226, 1230, 1132, 1234, 1236 allow signal vias 1128, 1146, 1148 to pass through power and ground planelets 1120, 1204, 1140, 1208.

Referring again to FIG. 11A, power vias 1132, 1152, 1172, 1192 provide an electrical connection to embedded power planelets 1120, 1140, 1160, 1180; and ground vias 1134, 1154, 1174, 1194 similarly provide electrical connections to corresponding embedded ground planes 1204, 1208 (only two are shown in FIGS. 11B and 11C). FIG. 11B is a cross section of probe head 1130 taken through power vias 1132, 1152 and ground vias 1134, 1154. As shown in FIG. 11B, power via 1132 provides an electrical connection to power planelet 1120, and ground via 1134 provides an electrical connection to ground planelet 1204. Similarly, power via 1152 and ground via 1154 provide electrical connections to power planelet 1140 and ground planelet 1208, respectively.

Each set of substantially parallel power and ground planelets provides a decoupling capacitance in parallel with the power supply (not shown) to the probe head. By selectively connecting adjacent power vias 1132, 1152, 1172, 1192 and adjacent ground vias 1134, 1154 1174, 1194, larger decoupling plane sets can be created. For example, as shown in FIG. 12, power vias 1132, 1152 are electrically connected by trace 1260, which effectively joins power planelets 1120, 1140. Similarly, trace 1270 electrically connects ground vias 1134, 1154, effectively joining ground planelets (not shown) corresponding to power planelets 1120, 1140. Traces 1260, 1270 may be formed in customization layers added to probe head 1130 in a manner similar to customization layers 802 in FIG. 8A, 950 in FIG. 9A, and 1050 in FIG. 10A. In this manner, a semistandard probe head base, such as 1130, may be prefabricated to include many sets of initially unconnected decoupling power and ground planelets. Thereafter, the sets of decoupling power and ground planelets may be selectively connected to form customize located and sized decoupling power and ground planes.

It should be noted that the sets of parallel power and ground planes illustrated in FIGS. 11A through 12 each include only one power plane and only one ground plane. The parallel sets may optionally include more than one power plane and/or more than one ground plane. One power plane and one ground plane are shown in FIGS. 11A to 12 to simplify the discussion.

Although the above described method of custom connecting coupling planelets has general applicability, it is particularly advantageous where multiple dice on a semiconductor wafer are being tested at the same time. By selectively connecting planelets as described above, one can create effective decoupling planes that generally correspond to each die being tested.

Figure 13A:
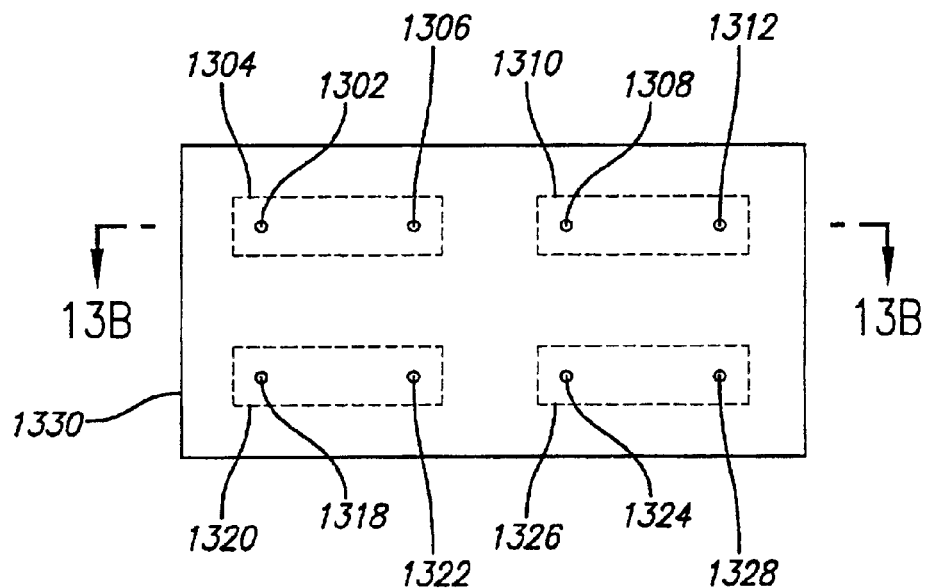
FIGS. 13A and 13B illustrate an exemplary probe head base with embedded impedance altering planelets.
Figure 13B:
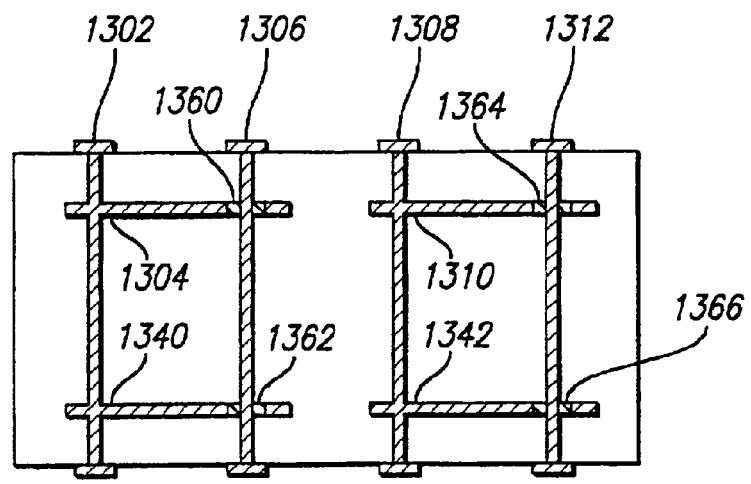

FIGS. 13A and 13B illustrate customizing the impedance of vias in a semistandard element, such as a probe head base. As shown in FIGS. 13A and 13B, an exemplary prefabricated, probe head base 1330 may include sets of substantially parallel embedded conductive planelets 1304, 1310, 1320, 1326 that surround signal vias 1306, 1312, 1322, 1328. FIG. 13A, being a top view, shows only the topmost planelet in each set 1304, 1310, 1320, 1326, and these are shown in dashed lines, indicating that they are embedded. As shown in FIG. 13B, which is a cross-section of FIG. 13A, each set of planelets includes two substantially parallel planlets. It should be noted, however, that the sets need not include two planelets; rather, each set may include as few as only one planlet each or may include more than two planlets each.

As shown in FIG. 13B, insulated holes 1360, 1362 allow signal via 1306 to pass through planelets 1304, 1340 without making electrical contact with the planelets. As also shown in FIG. 13B, insulated holes 1364, 1366 similarly allow signal via 1312 to pass through planelets 1310, 1342. Though not shown in FIG. 13B, similar insulated holes are provided in planelets 1320, 1326 for signal vias 1322, 1328. Planelet vias 1302, 1308, 1318, 1324 provide electrical access to the planelets 1304, 1310, 1320, 1326. This is best shown in FIG. 13B, which shows planelet via 1302 being electrically connected to a set of substantially parallel planelets 1304 and 1340, and planelet via 1308 being electrically connected to another set of substantially parallel planelets 1310, 1342. The impedance of a signal via can be manipulated by selectively connecting its associated planelet via to ground (ground connection not shown). For example, to alter the impedance of signal via 1312, its associated planelet via 1308 would be connected to ground. Any of the planelet vias 1302, 1308, 1318, 1324 may be selectively connected to a ground connection (not shown) by creating a conductive trace from the selected planelet vias to a ground connection (not shown) in customization layers (not shown), such as those illustrated in FIGS. 8A through 10B, on one or both sides of probe head base 1330.

In this manner, a semistandard probe head base, such as 1330, may be prefabricated to include many sets of initially inactivated ground planelet sets for altering an impedance of signal vias. Thereafter, the semistandard probe head base can be customized by selectively activating certain sets of ground planelets by connecting the selected sets of planelets to ground and thereby altering the impedance of associated signal vias.

Although application of the invention has been discussed above with respect to what might be considered a standard probe card design consisting of a printed circuit board and a probe head, the principles of the invention may be advantageously applied to a variety of probe card designs. Indeed, the invention does not require application to any particular probe card type or design, but is broadly applicable to all probe card types and designs.

Figure 14:
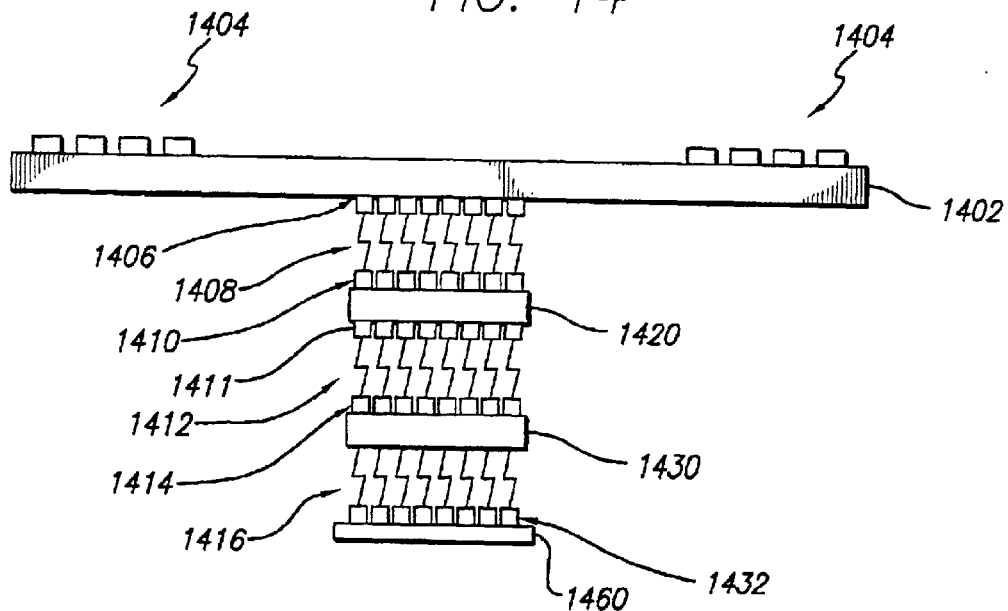
FIG. 14 illustrates a probe card assembly that includes an interposer.

A probe card having an interposer is one nonexclusive example of another probe card design to which the invention may be advantageously applied. As illustrated in FIG. 14 and described in U.S. Pat. No. 5,974,662, which is incorporated herein in its entirety by reference, such a probe card includes an interposer 1420 located between a printed circuit board 1402 and a probe head 1430. The printed circuit board 1402 may be a conventional printed circuit board having tester contacts 1404 for making electrical connections with a tester (not shown). The tester contacts 1404 are electrically connected to contacts 1406, which in turn are electrically connected to contacts 1410 on the interposer 1420 through interconnections 1408. Contacts 1410 on one side of the interposer 1420 are electrically connected to contacts 1411 on the other side of the interposer 1420, preferably by vias (not shown). Interconnections 1412 electrically connect contacts 1411 on the interposer 1420 to contacts 1414 on the probe head 1430, which in turn are connected, preferably by vias (not shown) to probes 1416. Probes 1416 make electrical connections to test points 1432 on a semiconductor device under test 1460. Interconnections 1408 and 1412 are preferably resilient spring-like interconnection elements, examples of which are described in the above mentioned U.S. Pat. No. 5,476,211, U.S. Pat. No. 5,917,707, and U.S. Pat. No. 6,184,053 B1. Probes 1416 may also be resilient spring-like interconnection elements.

Printed circuit board 1402 may be similar to printed circuit board 602, discussed above with reference to FIG. 6. Likewise, probe head 1430 may be similar to probe head 630, also discussed above with reference to FIG. 6. Like probe head 630 or 1430, interposer 1420 may be formed of a ceramic material with electrically conductive vias passing there through and, optionally, terminating in electrically conductive terminals on one or both sides of the interposer.

The probe card illustrated in FIG. 14 may be constructed in accordance with the principles discussed above and illustrated in FIGS. 4–13B. That is, one or more of the printed circuit board 1402, interposer 1420, and probe head 1430 may be prefabricated to one or more full standard designs, and one or more of the other of the printed circuit board, interposer, and probe head may be prefabricated to one or more semistandard designs. Then, upon receipt of data regarding a particular semiconductor design and tester and test algorithms for testing the semiconductor, prefabricated full standard and/or prefabricated semistandard printed circuit board 1402, interposer 1420, and probe head 1430 are selected, and the semistandard elements are customized to semiconductor design, tester, and test algorithms. Any of the methods for customization discussed above may be used. For example, customization layers, such as 802, 950, and 1050, may be added to either surface of the printed circuit board 1402, the interposer 1420, and/or the probe head 1430. In a preferred embodiment, the printed circuit board 1402 and the interposer 1420 are full standard, and customization is added only to the probe head 1430.

Figure 15:
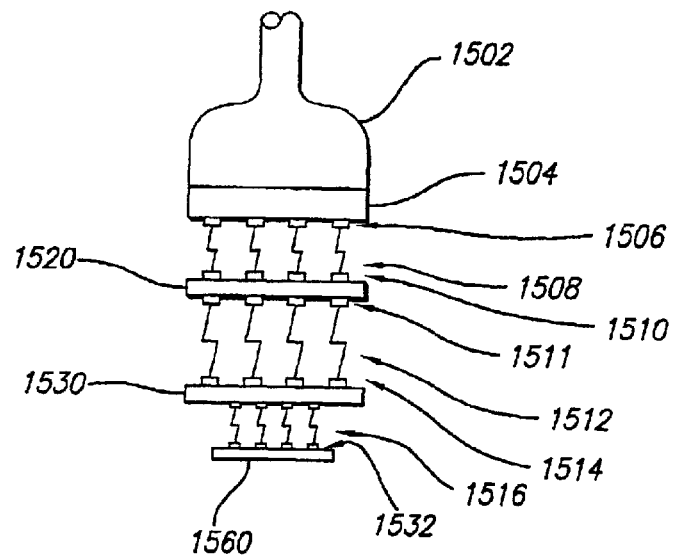
FIG. 15 illustrates a probe card assembly that includes a tester cable interface.

FIG. 15 illustrates another nonexclusive example of a probe card design to which the invention may be advantageously applied. In FIG. 15, a tester cable 1502 (which is connected to a tester not shown in FIG. 15) is electrically connected to a cable interface 1504. Contacts 1506 on the cable interface 1504 are electrically connected to contacts 1510 on an interposer 1520 by interconnections 1508, which preferably are resilient spring-like interconnections, such as those described in the above mentioned U.S. Pat. No. 5,476,211, U.S. Pat. No. 5,917,707, and U.S. Pat. No. 6,184,053 B1. Contacts 1511 on interposer 1520 are likewise connected to contacts 1514 on probe head 1530 by interconnections 1512 that are preferably resilient spring-like interconnections. Probes 1516 on probe head 1530 are arranged to contact test points 1532 on a semiconductor device under test 1560. This and similar probe card assemblies are described in copending patent application Ser. No. 09/886,521, filed Jun. 20, 2001, which is incorporated herein by reference in its entirety.

The probe card assembly illustrated in FIG. 15 may be constructed in accordance with the principles discussed above and illustrated in FIGS. 4–13B. That is, one or more of the cable interface 1504, interposer 1520, and probe head 1530 may be prefabricated to one or more full standard designs, and one or more of the other of the cable interface, interposer, and probe head may be prefabricated to one or more semistandard designs. Then, upon receipt of data regarding a particular semiconductor design and tester and test algorithms for testing the semiconductor, prefabricated full standard and/or prefabricated semistandard cable interface 1504, interposer 1520, and probe head 1530 are selected, and the semistandard elements are customized to semiconductor design, tester, and test algorithms. Any of the methods for customization discussed above may be used. For example, customization layers, such as 802, 950, and 1050, may be added to either surface of the cable interface 1504, the interposer 1520, and/or the probe head 1530. In a preferred embodiment, the cable interface 1504 and the interposer 1520 are full standard, and customization is added only to the probe head 1530.

Various modifications to the probe card assembly illustrated in FIG. 15 are possible, including without limitation, removing the interposer 1520 such that the cable interface 1504 and the probe head 1530 are directly connected rather than being connected through an interposer. The principles of the present invention are applicable to this and similar variations of the probe card assembly illustrated in FIG. 15.

Other probe card types or designs to which the principles of this invention may be advantageously applied include, with limitation: a probe assembly with a silicon-based probe head, such as is described in the above-mentioned U.S. patent application Ser. No. 09/042,606; and a probe assembly with multiple interposers, such as is described in U.S. patent application Ser. No. 09/528,064, filed Mar. 17, 2000, which is incorporated herein by reference in its entirety.

Figure 16:
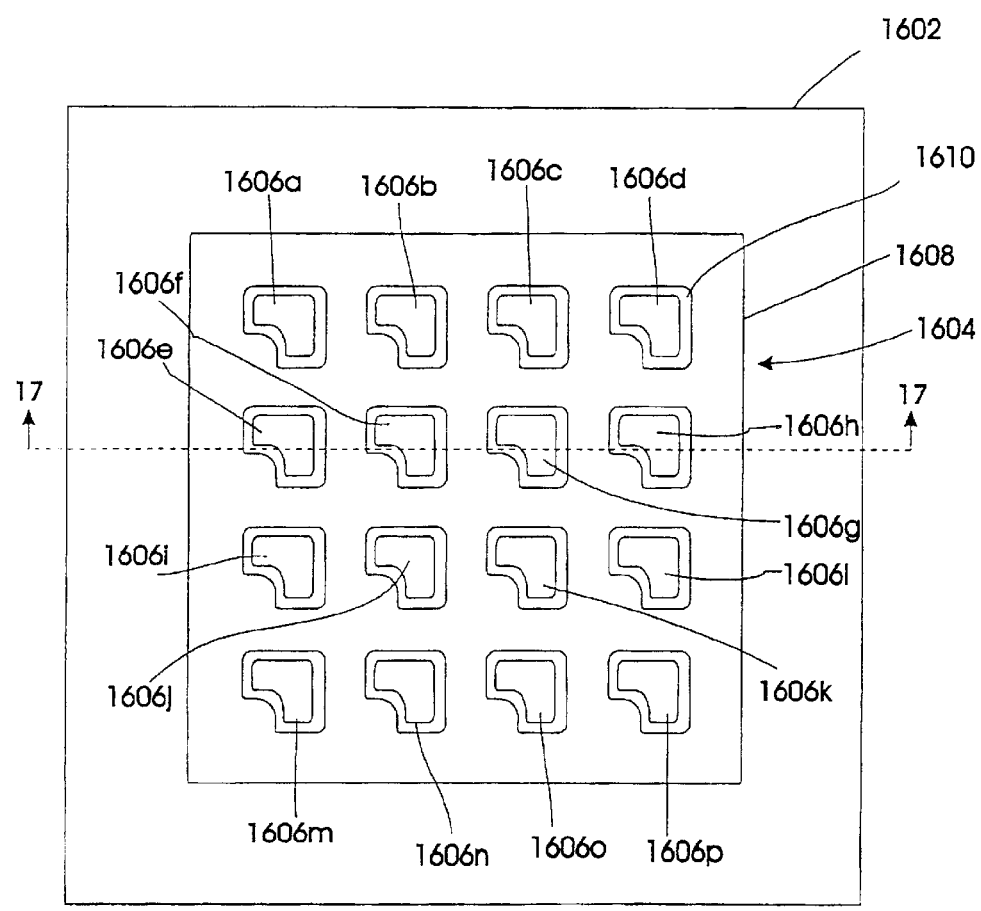
FIG. 16 illustrates an exemplary prefabricated probe head base.
Figure 17:
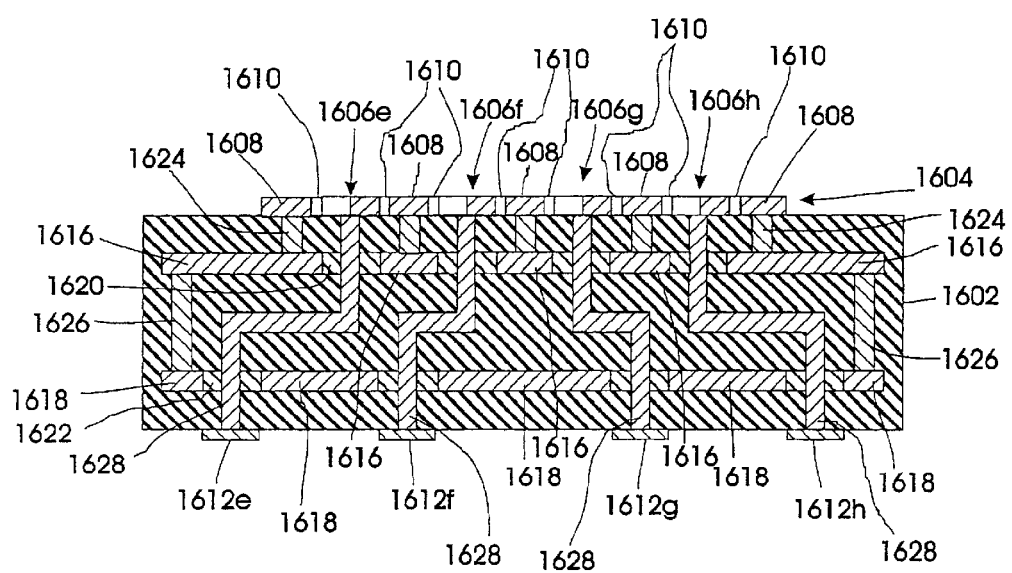
FIG. 17 is a cross-sectional view of FIG. 16.

FIGS. 16 and 17 illustrate another exemplary semistandard probe head base, which may be prepared at step 504 of FIG. 5 and then selected at step 706 of FIG. 7. As shown in FIGS. 16 and 17, the exemplary probe head base comprises a substrate 1602, which is preferably made of a nonconductive material or materials, such as ceramic or other durable materials. The semi-standard probe head base includes a prefabricated initial layer of conductive material 1604 disposed on a surface of the substrate 1602. The initial conductive layer 1604 includes a ground plane 1608 and a plurality of signal pads 1606a–1606p. The ground plane 1608 and the signal pads 1606a–1606p are electrically isolated from each other by spaces 1610. Insulating material may be disposed in spaces 1610.

Although the signal pads 1606a–1606p may be disposed in any pattern or layout, a two-dimensional grid pattern in which the signal pads are generally uniformly spaced from one another as shown in FIG. 16 is preferred. Moreover, in a preferred embodiment, the space 1610 between signal pads 1606a–1606p is approximately 2–20 mils, with approximately 4 mils being a particularly suitable spacing. Also in a preferred embodiment, the signal pads 1606a–1606p are disposed with a pitch of approximately 20–100 mils, with approximately 60 mils being a particularly suitable pitch. (Pitch, as used herein, refers to the distance between a point on a signal pad and a similar point on a neighboring pad.) Of course, the foregoing spacings and pitches are preferred and exemplary only, and the invention is not intended to be limited to the foregoing spacings and pitches.

In a preferred embodiment, signal pads 1606*l*–1606p are, as shown in FIGS. 16 and 17, larger than the area of intersection of vias 1628 with the surface of substrate 1602. This is believed to ease routing of traces that connect to a signal pad 1606. In addition, the signal pads 1606*l*–1606p are preferably generally square with a missing corner section, as shown in FIG. 16. This shape is believed to help increase the density of signal pads on the surface of the substrate 1606 and minimize the area occupied by the signal pads on the surface of the substrate. This shape is also believed to ease connecting traces to signal pads. Nevertheless, neither the size nor the shape of the signal pads 1606 is critical to the invention, and any size or shape may be used.

It should be understood that, although sixteen signal pads 1606a–1606p are illustrated in FIG. 16, any number of signal pads may be used. Indeed, in many applications hundreds or even thousands of signal pads would be used. Moreover, although ground plane 1608 is shown as being a single plane, ground plane 1608 could alternatively comprise a plurality of planes.

As shown in FIG. 17, signal pads 1606a–1606p are electrically connected to terminals 1612a–1612p (only terminals 1612e, 1612f, 1612g, 1612h are visible in FIG. 17) by signal vias 1628. As also shown in FIG. 17, the signal vias 1628 may include horizontal portions, so that the terminals 1612a–1612p on one side of the substrate are displaced from the signal pads 1606a–1606p on the other side of the substrate. Of course, the horizontal portions of signal vias 1628 may be sloped rather than being horizontal. Alternatively, the signal vias 1628 may be entirely vertical with no horizontal or sloped portion (examples of such vertical vias are not shown in FIG. 17). Of course, some of signal vias 1628 may be entirely vertical while others include horizontal or sloped portions.

One or more (two are shown in FIG. 17) conductive planes 1616, 1618 may be embedded in substrate 1602. In the example shown in FIGS. 16 and 17, the conductive planes 1616, 1618 are generally parallel to the outer surfaces of the probe base 1602, and may be generally the same shape and nearly the same size as the outer surfaces of the probe base. Nevertheless, the shape, size, and configuration of the conductive planes 1616, 1618 is not critical, and other shapes, sizes, and configurations may be used. As described more fully below, the conductive planes 1616, 1618 may be connected to a voltage source or ground and may serve to control the impedance of, shield, or otherwise affect electrical characteristics of the signal vias 1628. In the example shown in FIGS. 16 and 17, the ground plane 1608 on the surface of the substrate 1602 is electrically connected to conductive plane 1616 by vias 1624, and embedded plane 1616 is electrically connected to conductive plane 1618 by vias 1626. Holes 1620, 1622 are provided in embedded planes 1616, 1618, respectively, to allow signal vias 1618 to pass through the planes without electrically connecting the signal vias 1618 to the embedded plans 1616, 1618. The holes 1620, 1618 may include an insulating material.

Figure 18:
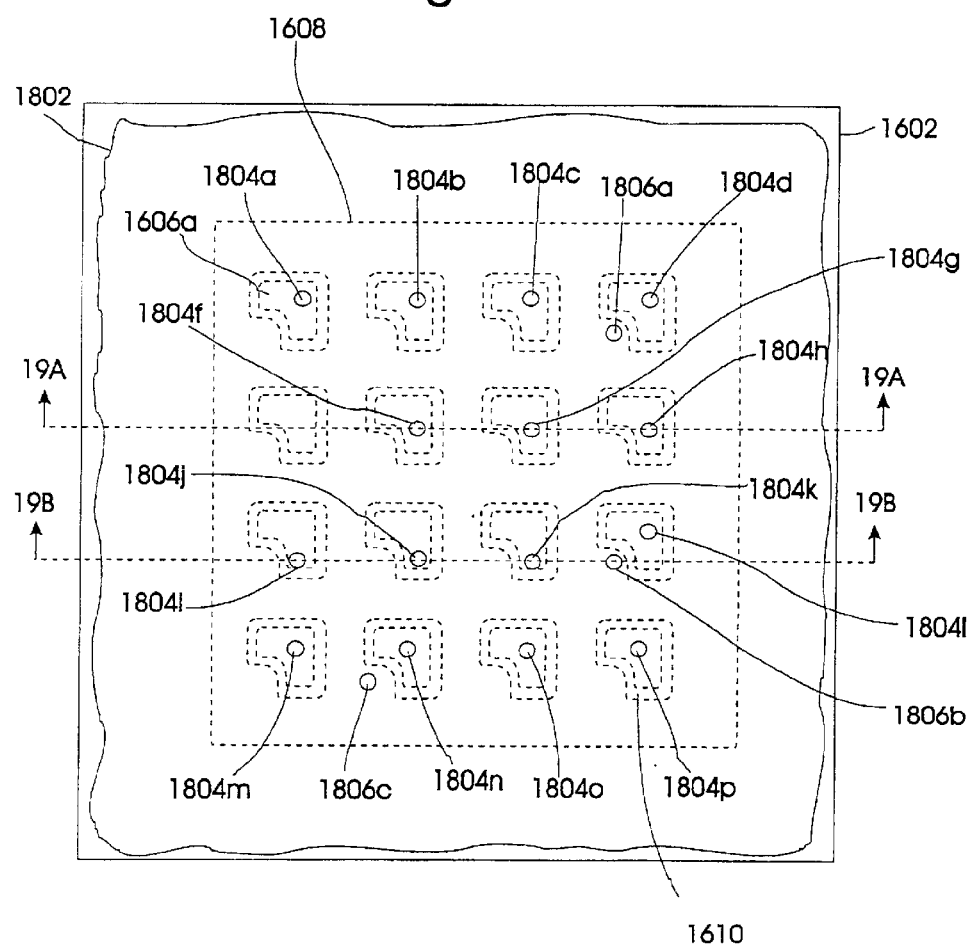
FIG. 18 illustrates an exemplary manner of adding customization to the exemplary probe head base of FIG. 17.

FIGS. 18–23 illustrate an exemplary customization of the probe head base shown in FIGS. 16 and 17 (step 708 of FIG. 7). As shown in FIGS. 18, 19A, and 19B, a layer of insulating material 1802 s formed over the prefabricated probe head base 1602. (Ground plane 1608 and signal pads 1606a–1606p are shown in dashed line to indicated that they are under the insulating material 1802.) A nonlimiting example of a suitable insulating material is polyimid. Holes 1804a–1804d, 1804f–1804p, and 1806a–1806c are left or formed in the insulating layer 1802. As will be discussed below, a custom conductive layer is formed over the insulating layer 1802, and the holes 1804a–d, 1804f–1804p, and 1806a–1806c are provided where interconnections are needed between the initial prefabricated conductive layer 1604 and the custom conductive layer. Those skilled in the field will be familiar with a variety of methods of forming an insulating material 1802 over the probe base 1602 and providing holes 1804a–1904d, 1804f–1804p, and 1806a–1806c in the insulating layer, and any such method may be used.

Figure 20:
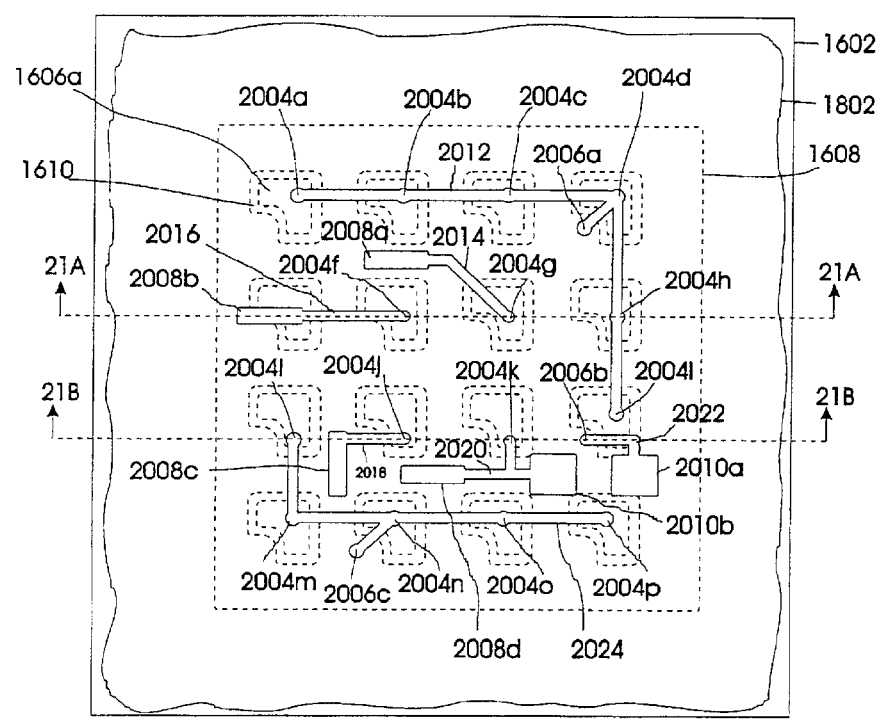
FIG. 20 illustrates an exemplary manner of adding further customization to the exemplary probe head base of FIG. 17.
Figure 21A:
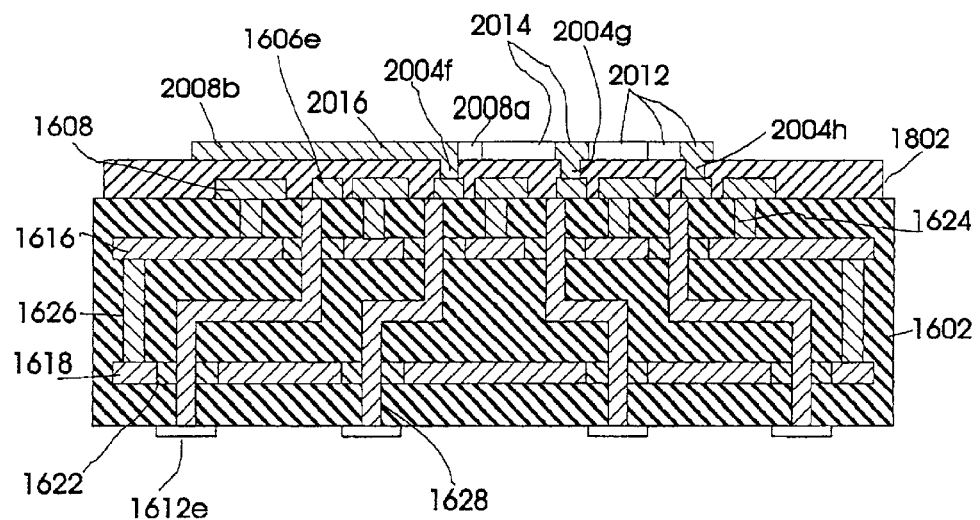
FIGS. 21A and 21B are cross-sectional views of FIG. 20.
Figure 21B:
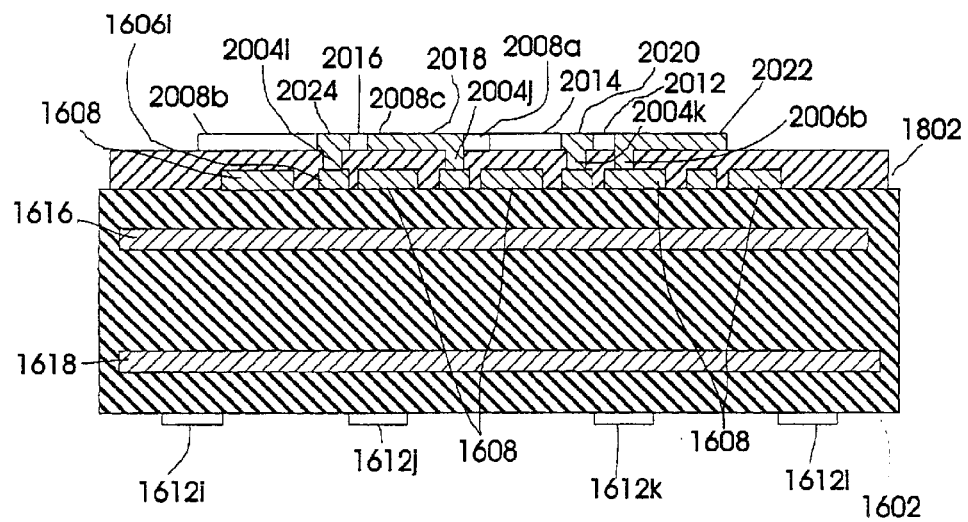

As shown in FIGS. 20, 21A, and 21B, a custom layer of conductive material is formed over the insulating layer 1802. The custom conductive layer may include, without limitation, conductive interconnections to the prefabricated conductive layer 1604, probe pads, electronic component pads, conductive traces, and/or other elements. Elements 2004a–2004d and 2004f–2004p in FIG. 20 illustrate examples of conductive interconnections, which are formed in the holes left in the insulating layer 1802. Elements 2008a–2008d in FIG. 20 illustrate examples of probe pads, which are conductive areas at which a probe element for probing a pad on a semiconductor device under test is to be formed or attached. Elements 2010a and 2010b in FIG. 20 are examples of electronic component pads, which are conductive areas at which a terminal of an electronic component, such as a capacitor, is to be formed or attached. Elements 20012, 2014, 2016, 2018, 2020, 2022, and 2024 in FIG. 20 illustrate examples of traces, which provide electrical connections between the conductive interconnections, probe pads, and electronic component pads. Those skilled in the field will be familiar with a variety of methods of forming a pattern layer of conductive material, and any such method may be used.

In the example shown in FIGS. 20, 21A, and 21B, signal pads 2004f, 2004g, 2004j, and 2004k are to be used in testing an integrated circuit. Probe pads 2008a, 2008b, 2008c, and 2008d are formed in locations so as to coincide with corresponding test points on the integrated circuit. Probe pad 2008a is electrically connected to signal pad 1606g through trace 2014 and interconnection 2004g, and probe pad 2008b is connected to signal pad 1606f through trace 2016 and interconnection 2004f. Probe pad 2008c is similarly connected to signal pad 1606j through trace 2018 and interconnection 2004j, and probe pad 2008d is connected to signal pad 1606k through trace 2020 and interconnection 2004k.

In this example, a capacitor is to be connected between probe pad 2008d and ground; one electronic component pad 2010b is therefore electrically connected to probe pad 2008d by trace 2020, and another electronic component pad 2010a is electrically connected to ground plane 1608 through trace 2022 and interconnection 2006b. Pads for other electronic components, such as resistors, diodes, microprocessors, microcontrollers, memories, etc., may also be included as needed. In this example, only signal pads 1606f, 1606g, 1606j, and 1606k will carry signals (which may include power and/or ground connections) to or from the integrated circuit to be tested. The other signal pads therefore may be connected to the ground plane 1608, which may improve the electrical performance of the probe head. In the example shown in FIG. 20, signal pads 1606a–1606d, 1606h, and 1606l are connected to each other by trace 2012 and interconnections 2004a–2004d, 2004h, and 2004l. Signal pads 1606a–1606d, 1606h, and 1606l are also connected to the ground plane 1608 through trace 2012 and interconnection 2006a. Unused signal pads 1606i and 1606m–1606p are similarly connected to each other and the ground plane 1608. That is, signal pads 1606i and 1606m–1606p are connected to each other by trace 2024 and interconnections 2004i and 2004m–2004p, and these signal pads are connected to the ground plane 1608 through trace 2024 and interconnection 2006c. In the example shown in FIGS. 20, 21A, and 21B, signal pad 1606e, although unused for testing the integrated circuit, is not connected to the ground plane 1608 because of the proximity of probe pad 2008b. Nevertheless, signal pad 1606e could also be connected to the ground plane 1608 and/or other unused signal pads.

It should be noted that, although traces 2012, 2014, 2016, 2018, 2020, 2022, and 2024 are shown for illustration purposes in FIG. 20 as being relatively thin, any one or more of the these traces may be made thicker. Indeed, it may be advantageous to form one or more of these traces as planes occupying as much of the unused area over the insulating layer 1802 is possible while insulating such a trace or traces from other portions of the custom conductive layer to which the trace or traces are not intended to be electrically connected. As those skilled in the field will recognize, increasing the size of the traces may improve electrical characteristics of the traces. Such traces may alternatively be formed as a mesh of conductive material.

Figure 22:
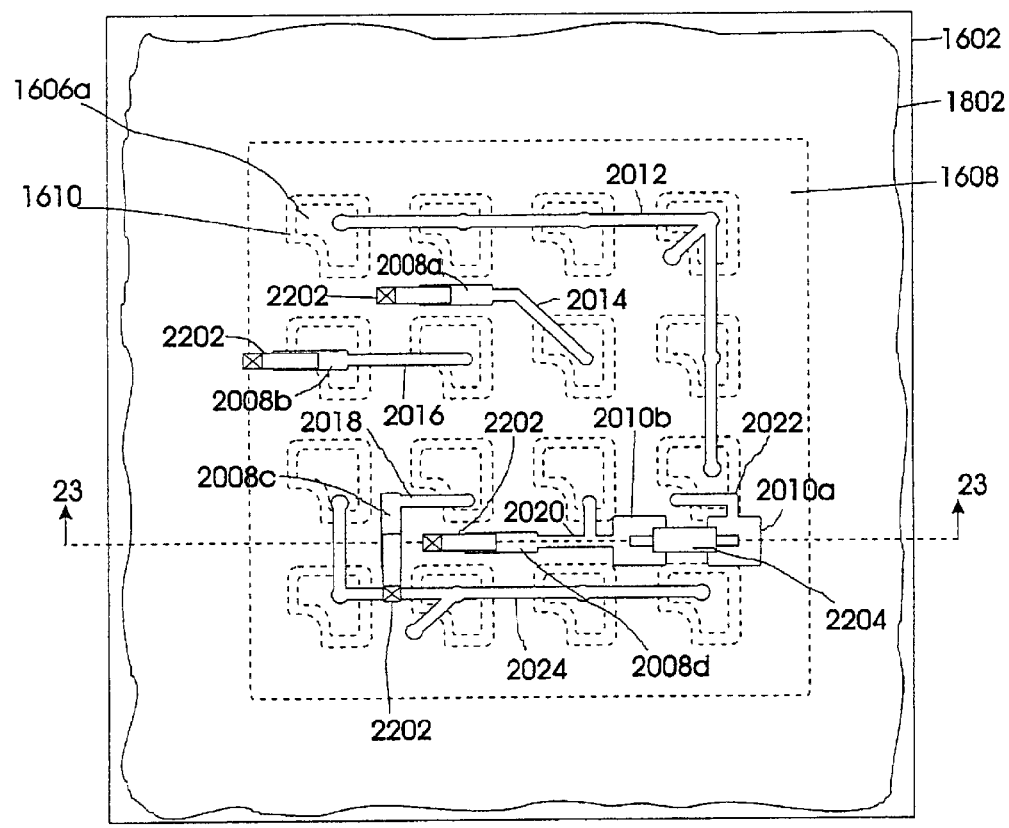
FIG. 22 illustrates adding exemplary probes and electronic components to the exemplary probe head base of FIG. 17.
Figure 23:
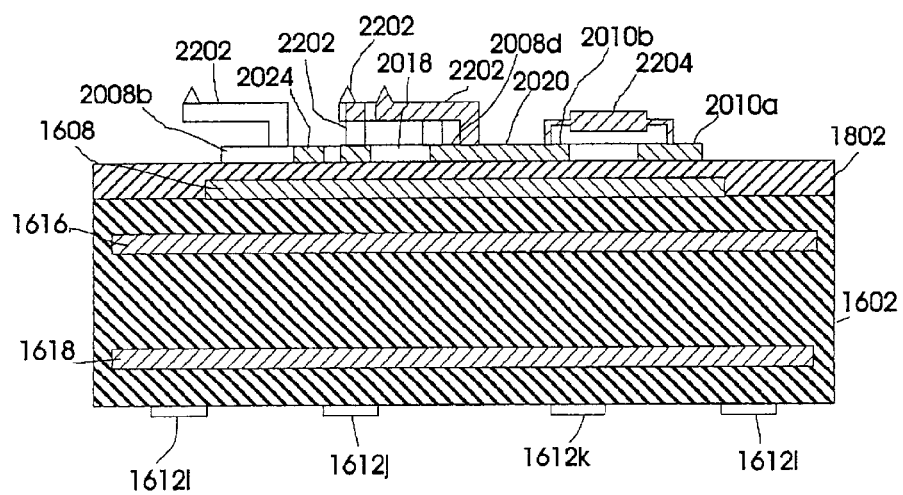
FIG. 23 is a cross-sectional views of FIG. 22.

As shown in FIGS. 22 and 23, a probe 2202 may be formed or placed on each of the probe pads 2008a, 2008b, 2008c, and 2008d. In this manner, electrically conductive paths are formed from the probes 2202 to signal pads 1606 to terminals 1612. As shown in FIGS. 22 and 23, an electronic component, such as a capacitor 2204, may be formed or placed on component pads 2010a and 2010b.

As should be apparent, probes 2202 have been custom placed on a standard probe base 1602 and custom electrical connections have been created between the probes 2202 through selected signal pads 1606 to selected terminals 1612 on the probe base 1602. In addition, electrical components, which may include without limitations capacitors, resistors, active electronic devices, etc., have been custom placed on the probe base 1602.

As should also be apparent, although not shown in the figures, a layer of a second insulating material may be formed over the custom patterned conductive layer comprising traces, 2012, 2014, etc. followed by another custom patterned conductive layer with vias (similar to vias 2004, 2006) formed in the second insulating layer to make electrical connections between the first custom patterned conductive layer and the second customer patterned conductive layer. Similarly, additional alternating layers of insulating material and custom patterned conductive material may be formed over the second custom patterned conductive layer. In such a case, pads for components (e.g., probes 2008 and capacitor 2204) that are to be secured to an outer surface of the probe substrate 1602 would be formed on the outermost custom patterned layer. Circuit elements, such as resistors, capacitors, diodes, active electronic circuits, may of course be formed or embedded in one or more of the alternating layers of insulating and patterned conductive layers.

Once the insulating layer 1802, custom conductive layer, and probes 2202 have been added to the probe base 1602 as described in the above example, the probe base 1602 may be subject to additional optional processing steps. Thereafter, the probe base 1602 may be joined to other elements (e.g., a printed circuit board 602 as shown in FIG. 8B, an interposer 1420, 1520 as shown in FIGS. 14 or 15, etc.) as generally described above with respect to step 710 in FIG. 7 and FIGS. 8A–15 to form a probe card assembly.

It should be noted that a ground connection or a reference voltage may be provided to one of the unused signal pads 1606 that is connected to ground plane 1608 through the probe card assembly. Alternatively, ground plane 1608 may be left floating. As yet another alternative, a probe 2202 located to contact a ground pad on an integrated circuit to be tested may be provided and electrically connected to the ground plane 1608. Of course, some combination of the foregoing may also be used.

Figure 24:
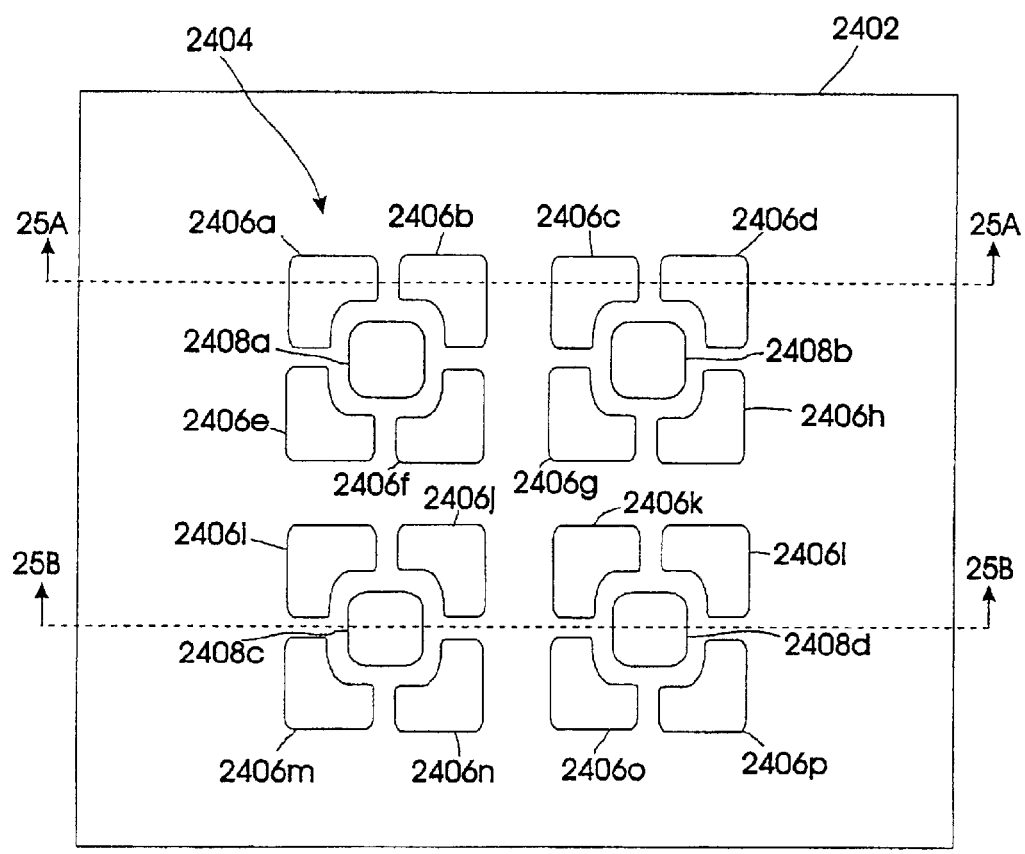
FIG. 24 illustrates an exemplary prefabricated probe head base.
Figure 25A:
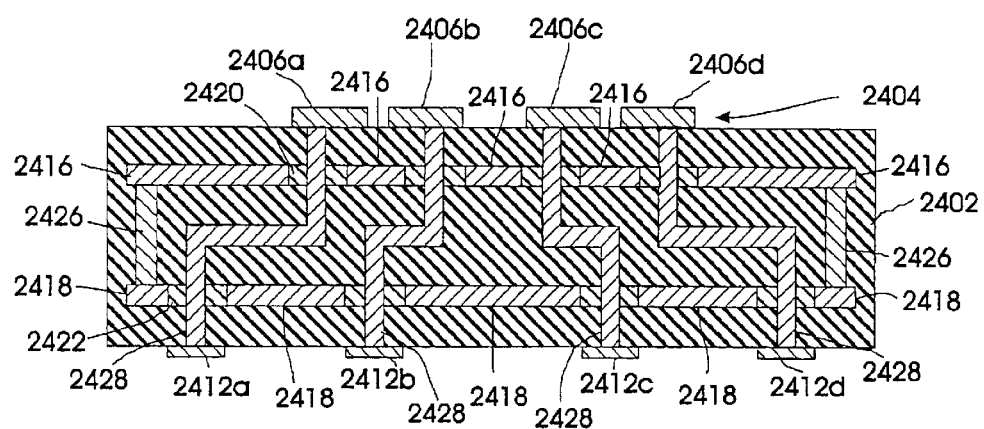
FIGS. 25A and 25B are cross-sectional views of FIG. 24.
Figure 25B:
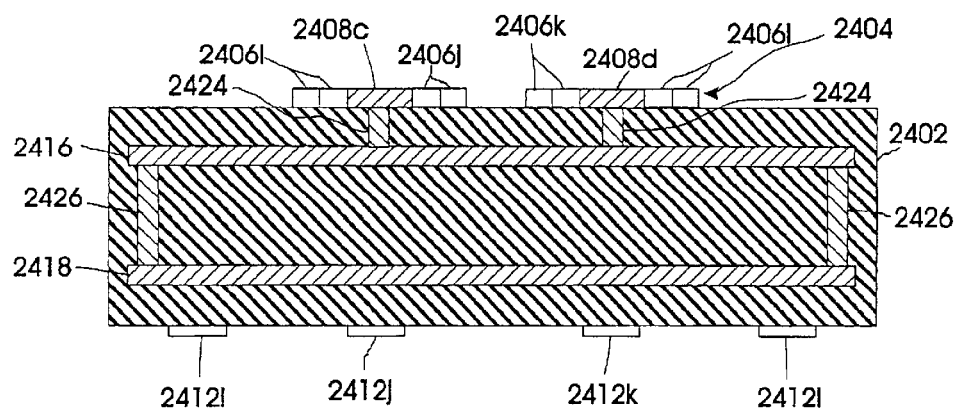

FIGS. 24, 25A, and 25B illustrate an exemplary variation of the exemplary semi-standard probe head base illustrated in FIGS. 16 and 17. The exemplary semi-standard probe head base illustrated in FIGS. 24, 25A, and 25B may also be prepared at step 504 of FIG. 5 and then selected at step 706 of FIG. 7.

As shown in FIGS. 24, 25A, and 25B, the exemplary probe head base comprises a substrate 2402, which is preferably made of a nonconductive material or materials, such as ceramic or other durable materials. The semi-standard probe head base includes a prefabricated initial patterned layer of conductive material 2404 disposed on a surface of the substrate 2402. The initial conductive layer 2404 includes signal pads 2406a–2406p and ground pads 2408*a*–2408*d*. The signal pads 2406*a*–2406*p* are electrically isolated from each other and from the ground pads 2408*a*–2408*d*.

Although the signal pads 2406*a*–2406*p* may be disposed in any pattern or layout, a two-dimensional grid pattern in which the signal pads are generally uniformly spaced from one another as shown in FIG. 24 is preferred. Moreover, in a preferred embodiment, the space between two adjacent signal pads 2406*a*–2406*p* is approximately 2–15 mils, with approximately 4 mils being a particularly suitable spacing. Also in a preferred embodiment, the signal pads 2406*a*–2406*p* are disposed with a pitch of approximately 15–50 mils, with approximately 30 mils being a particularly suitable pitch. Of course, the foregoing spacings and pitches are preferred and exemplary only, and the invention is not intended to be limited to the foregoing spacings and pitches.

In a preferred embodiment, signal pads 2406*l*–2406*p* are, as shown in FIGS. 24 and 25A, larger than the area of intersection of vias 2428 with the surface of substrate 2402. This is believed to ease routing of traces that connect to a signal pad 1606. In addition, the signal pads 2406*l*–2406*p* are preferably generally square with a missing corner section, as shown in FIG. 24. This shape is believed to help increase the density of signal pads on the surface of the substrate 2406 and minimize the area occupied by the signal pads on the surface of the substrate. This shape is also believed to ease connecting traces to signal pads. Nevertheless, neither the size nor the shape of the signal pads 2406 is critical to the invention, and any size or shape may be used.

It should be understood that, although sixteen signal pads 2406*a*–2406*p* and four ground pads 2408*a*–2408*d* are illustrated in FIG. 24, any number of signal pads and ground pads may be used. Indeed, in many applications hundreds or even thousands of signal pads would be used.

As shown in FIGS. 25A and 25B, signal pads 2406*a*–2406*p* are electrically connected to terminals 2412*a*–2412*p* (only terminals 2412*a*, 2412*b*, 2412*c*, 2412*d* are visible in FIG. 25A, and only terminals 2412*i*, 2412*j*, 2412*k*, 2412*l* are visible in FIG. 25B) by signal vias 2428. Like the example shown in FIG. 17, and as shown in FIG. 25A, the signal vias 2428 may include horizontal or sloped portions, and one or more (two are shown in FIGS. 25A and 25B) conductive planes 2416, 2418 may be embedded in substrate 2402. These conductive planes 2416, 2418 may be similar to the conductive planes 1616, 1618 in FIG. 17 as described above.

In the example shown in FIGS. 24, 25A, and 25B, and as shown in FIG. 25B, the ground pads 2408*a*–2408*d* are electrically connected to conductive plane 2416 by vias 2424, and conductive plane 2416 is electrically connected to conductive plane 2418 by vias 2426. As shown in FIG. 25A, holes 2420, 2422 are provided in conductive planes 2416, 2418, respectively, to allow signal vias 2418 to pass through the planes without electrically connecting the signal vias 2418 to the conductive plans 2416, 2418. The holes 2420, 2418 may include an insulating material.

FIGS. 26–29B illustrate an exemplary customization of the probe head base shown in FIGS. 24, 25A, and 25B (step 708 of FIG. 7). Similar to the customization of the probe head base illustrated in FIGS. 16 and 17 as described above, and as shown in FIGS. 26, 27A, 27B, and 27C, a layer of insulating material 2602 is formed over the prefabricated probe head base 2402, and a patterned conductive layer is formed over the insulating material 2602. (In FIG. 26, signal pads 2406*a*–2406*p* and ground pads 2408*a*–2408*d* are shown in dashed line to indicated that they are under the insulating material 2602 and the patterned conductive layer.) The insulating layer 2602 and the patterned conductive layer may be generally similar to the insulating layer 1802 and patterned conductive layer as described above with respect to FIGS. 18–21B.

Figure 26:
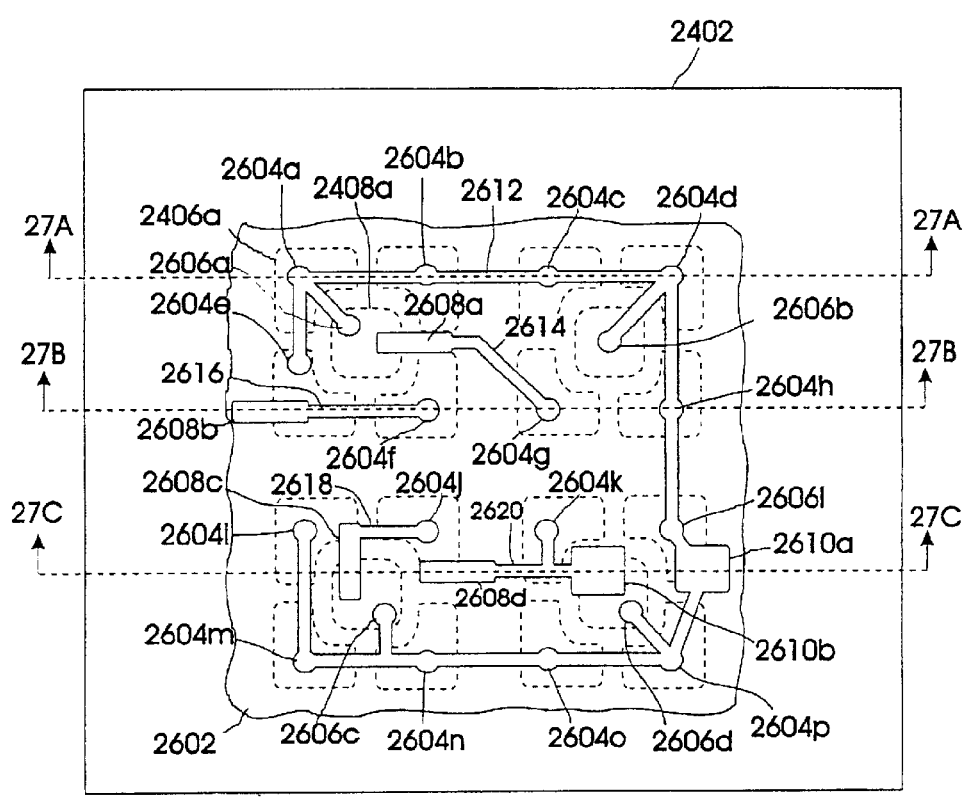
FIG. 26 illustrates an exemplary manner of adding customization to the exemplary probe head base of FIG. 24.
Figure 27A:
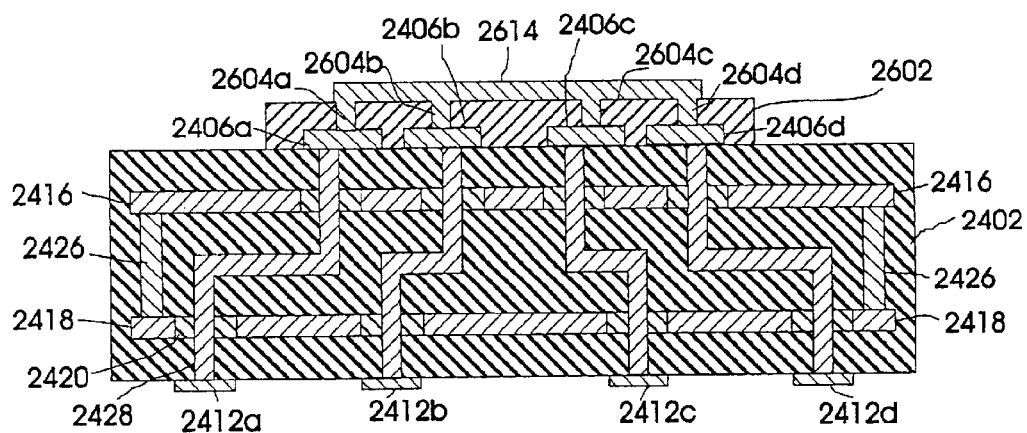
FIGS. 27A, 27B, and 27C are cross-sectional views of FIG. 26.
Figure 27B:
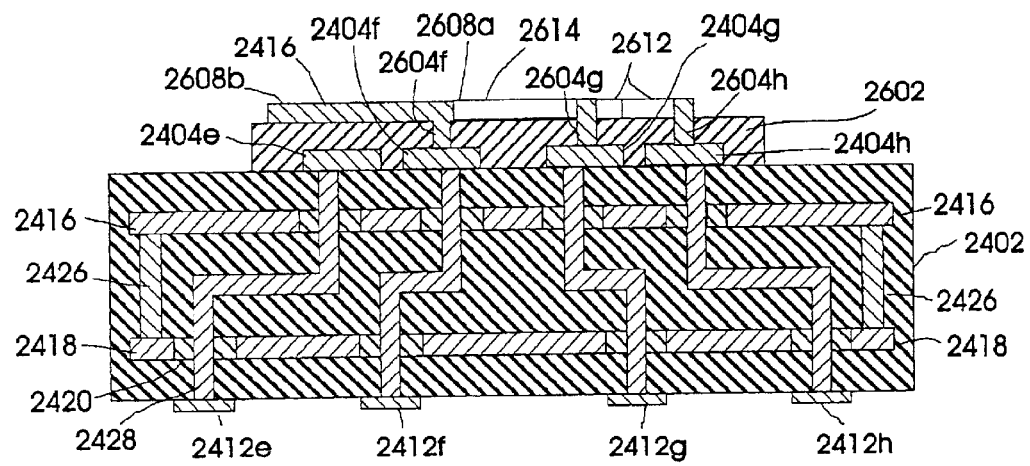
Figure 27C:
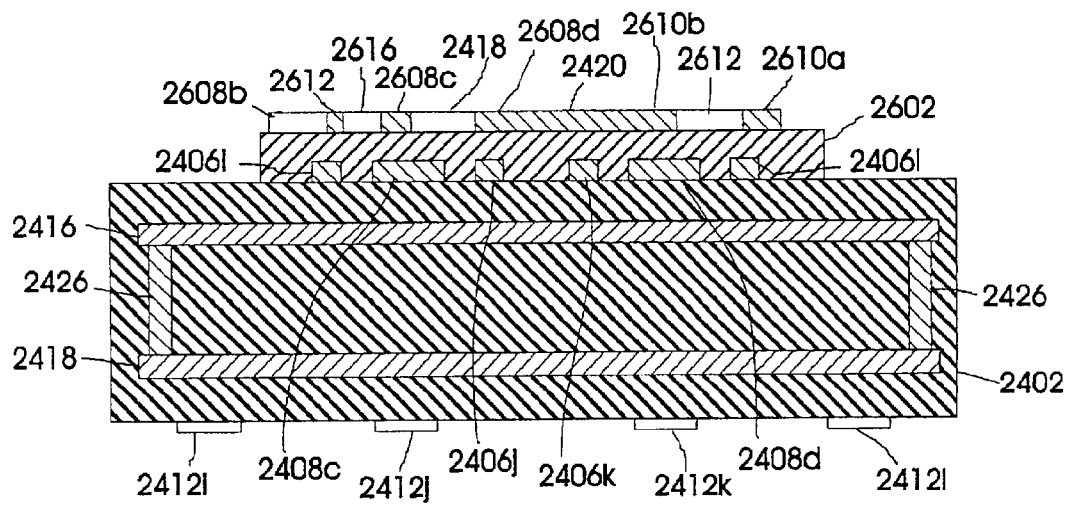

As described above with respect to FIGS. 18, 19A, and 19B, holes are left in the insulating material 2602 at places where a connection between the prefabricated initial conductive layer 2404 (the signal pads 2406*a*–2406*p* and ground pads 2408*a*–2408*d*) and the patterned conductive layer. As also described above, with respect to FIGS. 20, 21A, and 21B, the custom patterned conductive layer formed over the insulating material 2602 may include, without limitation, conductive interconnections to the signal pads 2406*a*–2406*p*, conductive interconnections to the ground pads 2408*a*–2408*d*, probe pads, electronic component pads, conductive traces, and/or other elements. Elements 2604*a*–2604*p* and 2606*a*–2606*d* in FIG. 26 illustrate examples of conductive interconnections, which are formed in the holes left in the insulating layer 2602 and provide electrical connections through the insulating layer 2602 between the initial patterned conductive layer 2404 and the custom patterned conductive layer. Elements 2608*a*–2608*d* in FIG. 26 illustrate examples of probe pads, which are conductive areas at which a probe element for probing a pad on a semiconductor device under test is to be formed or attached. Elements 2610*a* and 2610*b* in FIG. 26 illustrate examples of electronic component pads, which are conductive areas at which a terminal of an electronic component, such as a capacitor, is to be formed or attached. Elements 2612, 2614, 2616, 2618, 2620 in FIG. 26 illustrate examples of traces, which provide electrical connections between the conductive interconnections, probe pads, and electronic component pads.

In the example shown in FIGS. 26, 27A, 27B, and 27C, only signal pads 2406*f*, 2406*g*, 2406*j*, and 2406*k* are to be used in testing an integrated circuit. Probe pads 2608*a*, 2608*b*, 2608*c*, and 2608*d* are formed in locations so as to coincide with corresponding test points on the integrated circuit. Probe pad 2608*a* is electrically connected to signal pad 2406*g* through trace 2614 and interconnection 2604*g*, and probe pad 2608*b* is connected to signal pad 2406*f* through trace 2616 and interconnection 2604*f*. Probe pad 2608*c* is similarly connected to signal pad 2406*j* through trace 2618 and interconnection 2604*j*, and probe pad 2608*d* is connected to signal pad 2406*k* through trace 2620 and interconnection 2604*k*.

In this example, a capacitor is to be connected between probe pad 2608*d* and ground; one electronic component pad 2610*b* is therefore electrically connected to probe pad 2608*d* by trace 2620, and another electronic component pad 2610*a* is electrically connected to a ground pad 2408*d* through trace 2612 and interconnection 2606*b*. Pads for other electronic components, such as resistors, diodes, microprocessors, microcontrollers, memories, etc., may also be included as needed. In this example, only signal pads 2406f, 2406g, 2406j, and 2406k will carry signals (which may include power and ground connections) to or from the integrated circuit to be tested. The other signal pads therefore may be connected to ground, which may improve the electrical performance of the probe head base. In the example shown in FIG. 26, each of the unused signal pads 2406a–2406d, 2406e, 2406h, 2406i, 2406l, and 2406m–2406p are connected to each other by trace 2612 and interconnections 2604d, 2604e, 2604h, 2604i, 2604l, and 2604m–2604p, and trace 2612 is connected to each of the ground pads 2408a–2408d by interconnections 2606a–2606d.

As discussed above with respect to FIG. 20, although traces 2612, 2614, 2616, 2018, and 2020 are shown for illustration purposes in FIG. 26 as being relatively thin, any one or more of the these traces may be made thicker. For example, one or more of these traces may be formed as planes (or meshes) occupying as much of the unused area over the insulating layer 2602 is possible while insulating such a trace or traces from other portions of the custom conductive layer to which the trace or traces are not intended to be electrically connected.

Figure 28:
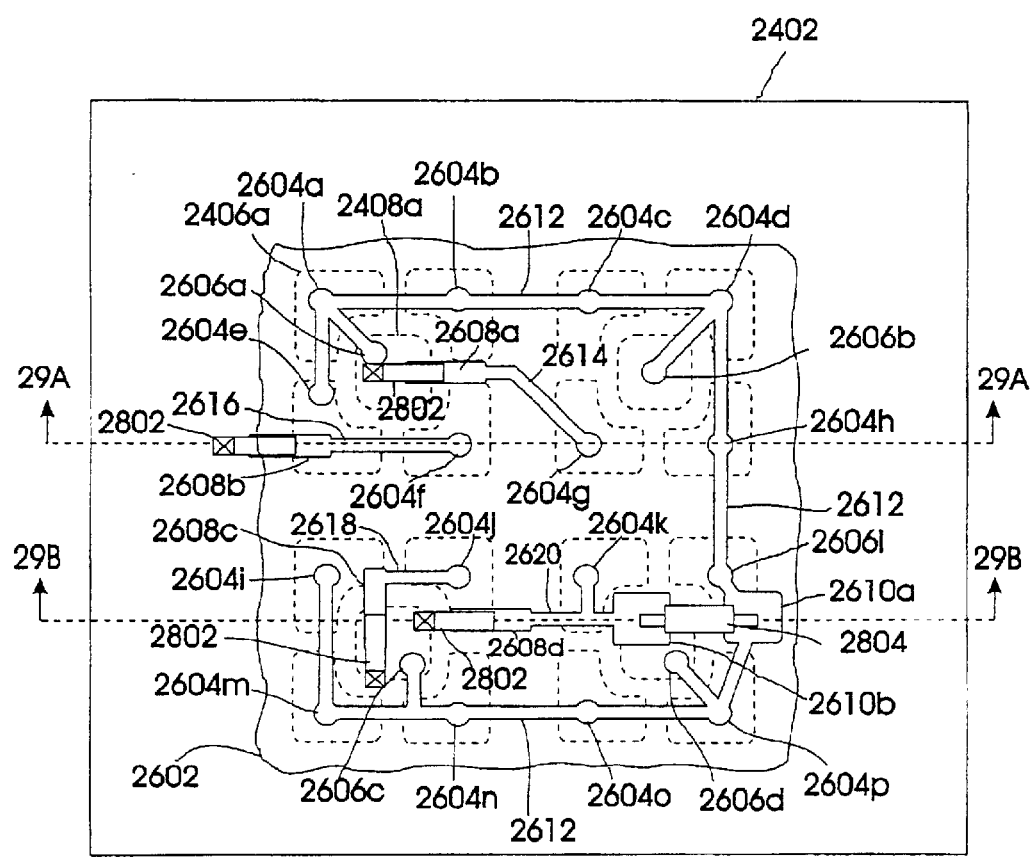
FIG. 28 illustrates adding exemplary probes and electronic components to the exemplary probe head base of FIG. 24.
Figure 29A:
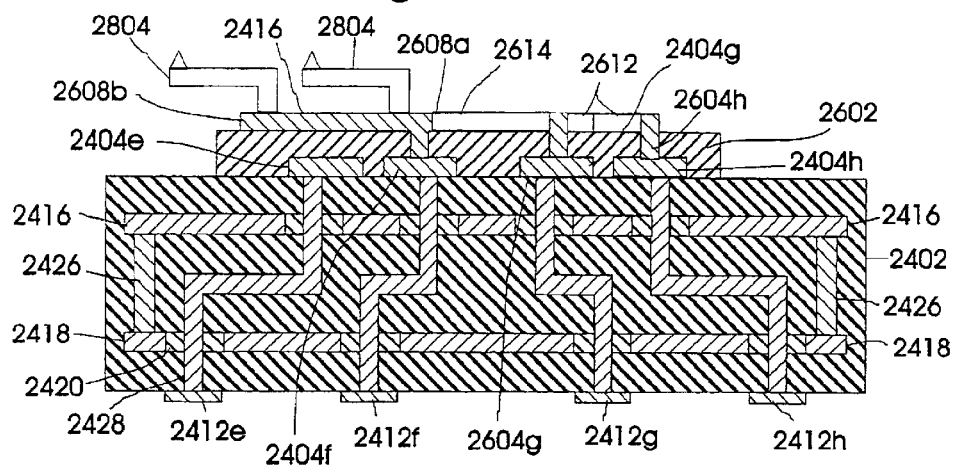
FIGS. 29A and 29B are cross-sectional views of FIG. 28.
Figure 29B:
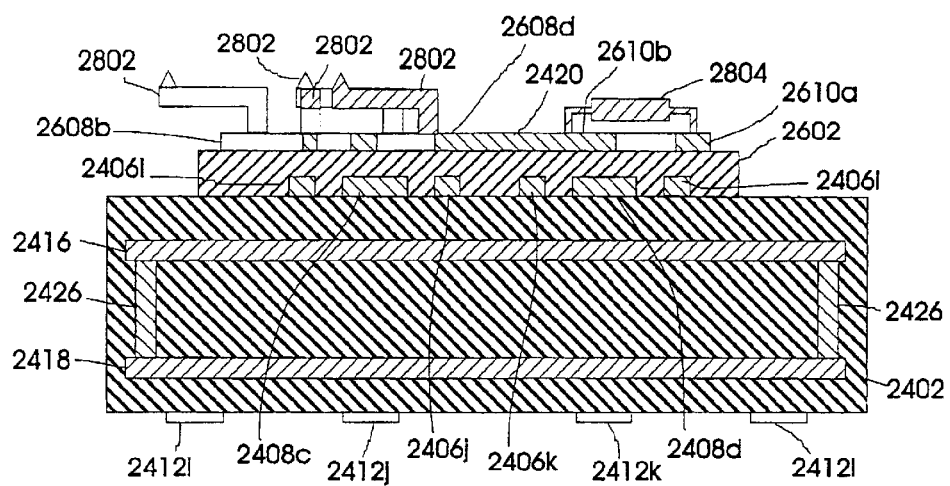

As shown in FIGS. 28, 29A, and 29B, a probe 2802 may be formed or placed on each of the probe pads 2608a, 2608b, 2608c, and 2608d, providing electrically conductive paths from the probes 2802 to signal pads 2406 to terminals 2412. In the example shown in FIGS. 28, 29A, and 29B, an electronic component, such as a capacitor 2804, is formed or placed on component pads 2610a and 2610b.

Thus, probes 2802 have been custom placed on a standard probe base 2402 and custom electrical connections have been created between the probes 2802 through selected signal pads 2406 to selected terminals 2412 on the probe base 2402. In addition, electrical components, which may include without limitations capacitors, resistors, active electronic devices, etc., have been custom placed on the probe base 2402. Of course, once the insulating layer 2602 and custom conductive layer have been added to the probe base 2402 as described in the above example, the probe base 2402 may be subject to additional optional processing steps. For example, as discussed above with respect to the example shown in FIGS. 16–23, additional alternating layers of insulating material and custom patterned conductive material may be added. Thereafter, the probe base 2402 may be joined to other elements (e.g., a printed circuit board 602 as shown in FIG. 8B, an interposer 1420, 1520 as shown in FIGS. 14 or 15, etc.) as generally described above with respect to step 710 in FIG. 7 and FIGS. 8A–15 to form a probe card assembly.

It should be noted that a ground connection or a reference voltage may be provided to one of the unused signal pads 2406 that is connected to ground pads 2408 through the probe card assembly. Alternatively, the interconnected unused signal pads 2406 and ground pads 2408 may be left floating. As yet another alternative, a probe 2802 located to contact a ground pad on an integrated circuit to be tested may be provided and electrically connected to the interconnected unused signal pads 2406 and ground pads 2408. Of course, some combination of the foregoing may also be used.

FIG. 30 illustrates another exemplary semi-standard probe head base, which may be prepared at step 504 of FIG. 5 and then selected at step 706 of FIG. 7. As shown in FIG. 30, the exemplary probe head base comprises a substrate 3002, which is preferably made of a nonconductive material or materials, such as ceramic or other durable materials. The semi-standard probe head base includes a predetermined pattern of conductive pads on one surface of the substrate 3002.

The pads are arranged in a pattern designed to ease custom routing, which will be described below. An exemplary pattern is illustrated in FIG. 30. As shown in FIG. 30, the pads are organized roughly into horizontal (relative to FIG. 30) groups 3004, 3006, 3008, 3010, 3012, 3014. Groups 3004 and 3014 include power pads and capacitor pads, and groups 3006, 3008, 3010, 3012 include signal pads. The signal pads are connected through vias (not shown) in substrate 3002 to terminals (not shown) on the opposite surface of the substrate. For example, the signal pads shown in FIG. 30 may be connected to terminals on the opposite surface of the substrate 3002 in the same way in which signal pads 1606(e)–1606(h) are connected to terminals 1612(e)–1612(h) by vias 1628 in FIG. 17. The power and capacitor pads in groups 3004 and 3014 may be connected to one or more power or ground planes or connections in or on substrate 3002. As will be described, the size and spacing between signal pads in horizontal groups 3006, 3008, 3010, 3012 increases with distance from a point on substrate 3002, such as center point 3019.

Figure 31:
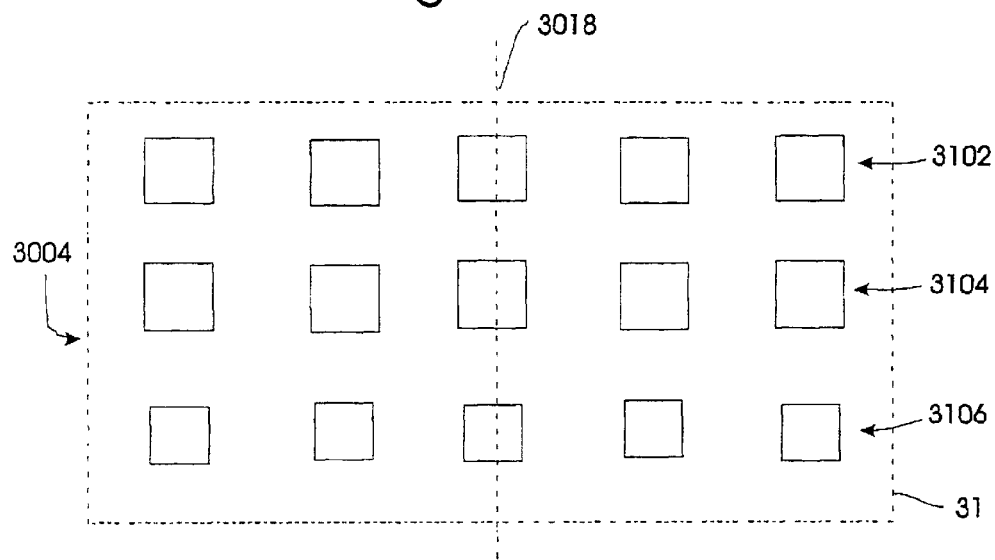
FIGS. 31–34 illustrate partial views of the probe head base of FIG. 30.

FIG. 31 illustrates a portion 31 of the first horizontal group of pads 3004. (FIG. 31 shows a portion of pads from the first horizontal group of pads 3004 near an imaginary line 3018 through the center of substrate 3002 as shown in FIG. 30.) As discussed above, the first horizontal group of pads 3004 includes capacitor pads and power pads. In the exemplary configuration of the first horizontal group of pads 3004 shown in FIG. 31, there are three individual rows of pads in the first horizontal group 3004. These three horizontal rows include a row of pads 3102 for receiving the grounded terminal of a by-pass capacitor, a row of pads 3104 for receiving the power terminal of a by-pass capacitor, and a row of power pads 3106. Each pad in row 3102—which are for receiving the grounded terminal of a by-pass capacitor—is connected to ground. For example, each pad in row 3102 may be connected to a ground plane embedded in or disposed on the substrate 3002. Of course, there may be one or more ground planes associated with substrate 3002. Each pad in row 3104—which are for receiving the power terminal of a by-pass capacitor—is connected to a source of power. For example, each pad in row 3104 may be connected to a power plane embedded in or disposed on the substrate 3002. Again, there may be one or more power planes associated with substrate 3002. Each power pad—row 3106—is also connected to power (e.g., a power plane), and as will be seen, may be used to provide power to integrated circuits being tested. Each power pad in row 3106 may be internally connected to one or more of the pads in row 3104. Indeed, preferably, each power pads in row 3106 is internally connected to the pad in row 3104 that is directly above the power pad.

Figure 32:
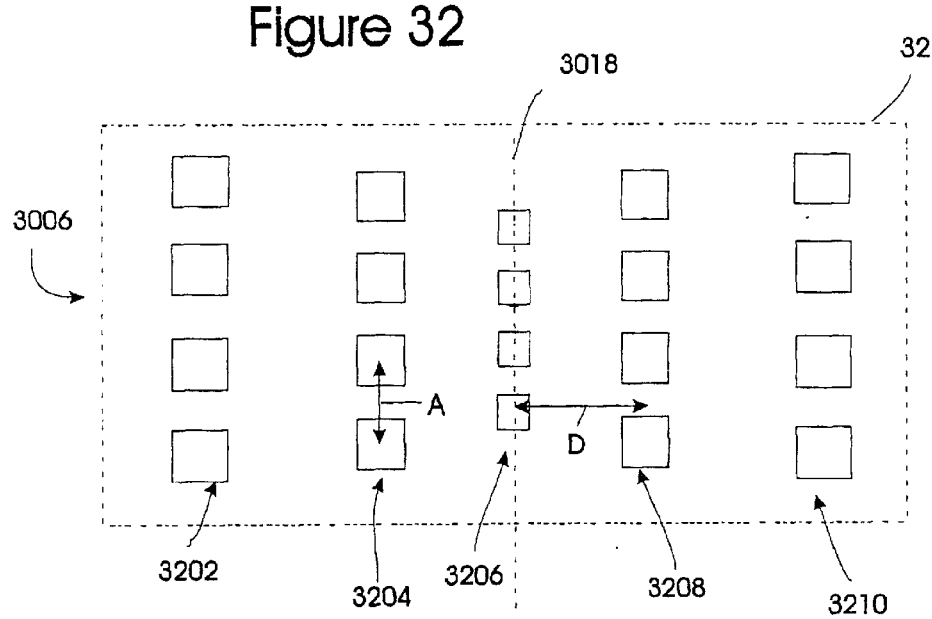

FIG. 32 illustrates a portion 32 of the second horizontal group of pads 3006 on substrate 3002. (FIG. 32 shows a portion of pads from the second horizontal group of pads 3008 near center line 3018.) As discussed above, the second horizontal group of pads 3006 also includes signal pads whose size and spacing varies with each pad's distance from center point 3019. In the exemplary pattern shown in FIG. 32, the signal pads in the second horizontal group of pads 3006 are arranged in columns of four signal pads each 3202, 3204, 3206, 3208, 3210. The size of and spacing between the signal pads increases with a particular pad's distance from the center point 3019 (FIG. 30).

In the exemplary pattern illustrated in FIG. 32, two spacings between the signal pads vary with a particular pad's distance from center point 3019. The first of these spacings is labeled "A" in FIG. 32 and is the vertical (relative to FIG. 32) distance between adjacent pads in a column (e.g., columns 3202, 3204, 3206, 3208, or 3210). The second spacing is labeled "D" in FIG. 32 and is the horizontal (relative to FIG. 32) distance between pads in adjacent columns 3202, 3204, 3206, 3208, or 3210.

Figure 33:
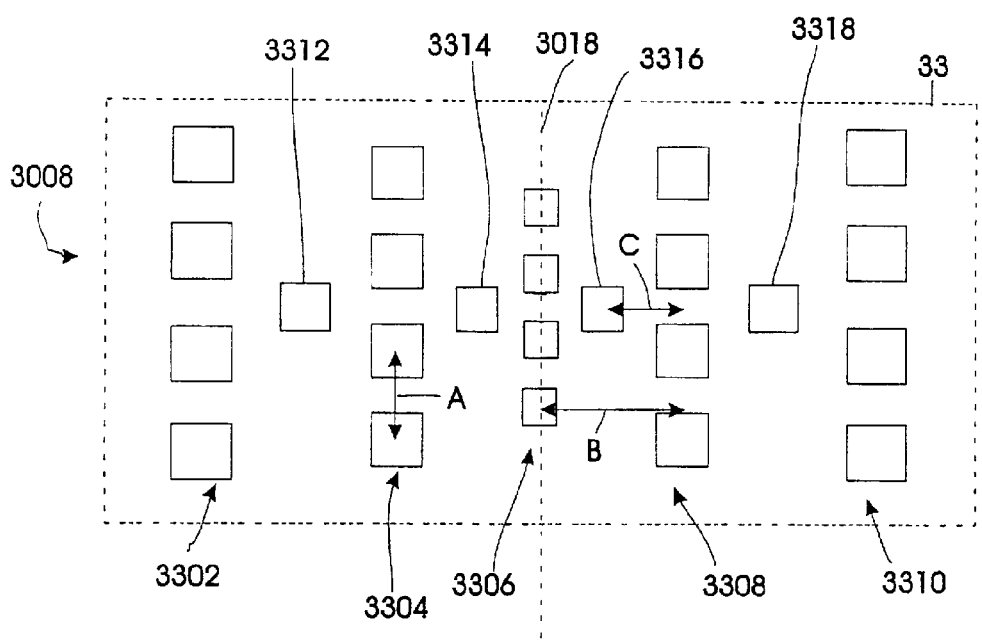

FIG. 33 illustrates a portion 33 of the third horizontal group of pads 3008 on substrate 3002. (FIG. 33 shows a portion of pads from the third horizontal group of pads 3008 near center line 3018.) As discussed above, the third horizontal group of pads 3008 includes signal pads whose size and spacing varies with each pad's distance from center point 3019 (as shown in FIG. 30). In the exemplary pattern shown in FIG. 33, the signal pads in the third horizontal group 3008 are arranged in columns of four signal pads each 3302, 3304, 3306, 3308, 3310, with a single signal pad 3312, 3314, 3316, 3318 disposed between each column. As described in more detail below, the size of and spacing between signal pads increases with a particular pad's distance from a center point 3019 on substrate 3002 (as shown in FIG. 30).

In the exemplary pattern illustrated in FIG. 33, three spacings between pads vary with a particular pad's distance from the center point 3019 shown in FIG. 30. The first of these spacings is labeled "A" in FIG. 33 and is the vertical (relative to FIG. 33) distance between adjacent pads in a column (e.g., columns 3302, 3304, 3306, 3308, or 3310). The second spacing is labeled "B" in FIG. 33 and is the horizontal (relative to FIG. 33) distance between pads in adjacent columns. The third spacing is labeled "C" in FIG. 33 and is the horizontal (relative to FIG. 33) distance between center points of an individual signal pad 3312, 3314, 3316, or 3318 and adjacent columns of pads 3302, 3304, 3306, 3308, 3310.

Figure 34:
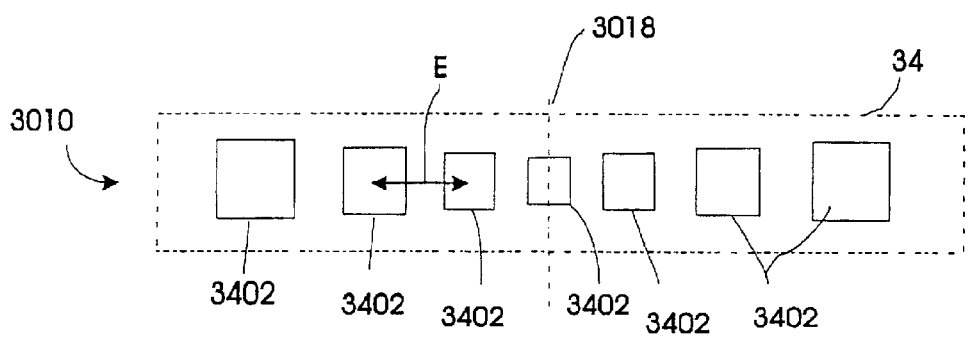

FIG. 34 illustrates a portion 34 of the fourth horizontal group of pads 3010 on substrate 3002. (FIG. 34 shows a portion of pads from the fourth horizontal group of pads 3010 near center line 3018.) As discussed above, the fourth horizontal group of pads 3010 also includes signal pads whose size and spacing varies with each pad's distance from center point 3019 (FIG. 30). In the exemplary pattern shown in FIG. 34, the signal pads in the fourth horizontal group of pads 3010 comprise a single row of signal pads 3402. The size of and spacing between the signal pads increases with a particular pad's distance from the center point 3019 (FIG. 30) of substrate 3002.

In the exemplary pattern illustrated in FIG. 34, one spacing between pads varies with a particular pad's distance from center point 3019. This spacing is labeled "E" in FIG. 34 and, as shown in FIG. 34, is the horizontal (relative to FIG. 34) distance between adjacent pads.

In the exemplary pattern illustrated in FIG. 30, the fifth group of horizontal pads 3012 is similar to the second group of horizontal pads 3006. In the exemplary pattern shown in FIG. 30, the sixth group of horizontal pads 3014 is generally similar to the first group of horizontal pads 3004 but is inverted or the mirror image of the first group of horizontal pads.

As discussed above, the size of a particular signal pad in horizontal groups 3006, 3008, 3010, and 3012 and the particular pad's spacing from adjacent pads changes (preferably increases) with the particular signal pad's radial distance from a point on the substrate 3002, for example, point 3019 located at the center of substrate 3002. In a preferred embodiment, the size and spacing between pads is selected to fall within the ranges indicated in Table I below.

TABLE I

| Distance from center (in.): | Pad size (mils): | "A" (mils): | "B" (mils): | "C" (mils): | "D" (mils): | "E" (mils): |
|---|---|---|---|---|---|---|
| 0–0.25 | 5–8 | 9–13 | 28–33 | 14–17 | 35–40 | 9–13 |
| 0.26–0.5 | 7–10 | 11–13 | 15–17 | 37–40 | 11–13 |
| 0.51–0.75 | 10–13 | 14–18 | 14–18 | 16–19 | 40–45 | 14–18 |
| 0.76–1.0 | 12–15 | 16–18 | 16–18 | 18–19 | 42–45 | 16–18 |
| >1.0 | 15–18 | 17–20 | 17–20 | 18–20 | 44–46 | 17–20 |

In the foregoing Table I (and in Tables II through IV below), "Distance from center" refers to the horizontal (relative to FIG. 30) distance between center point 3019 and the center of a pad in inches; "Pad size" refers to the length of a side of a square pad in mils; and "A," "B," "C," "D," and "E" refer to the spacings in mils with like letter designations as defined above with reference to FIGS. 32–34. In practice, one would select particular numbers in each of the above ranges for pad size and the spacings. For example, the following three tables provide examples of implementations selected from the above described ranges for pad size and spacings that have been found to be particularly advantageous.

EXAMPLE 1

TABLE II

| Distance from center (in.): | Pad size (mils): | "A" (mils): | "B" (mils): | "C" (mils): | "D" (mils): | "E" (mils): |
|---|---|---|---|---|---|---|
| 0–0.25 | 7.42126 | 9.02126 | 28.82126 | 14.42063 | 35.42126 | 9.02126 |
| 0.26–0.5 | 9.92126 | 11.52126 | 31.32126 | 15.66063 | 37.92126 | 11.52126 |
| 0.51–0.75 | 12.42126 | 14.02126 | 33.82126 | 16.91063 | 40.42126 | 14.02126 |

TABLE II-continued

| Distance from center (in.): | Pad size (mils): | "A" (mils): | "B" (mils): | "C" (mils): | "D" (mils): | "E" (mils): |
|---|---|---|---|---|---|---|
| 0.76–1.0 | 14.92126 | 16.52126 | 36.32126 | 18.16063 | 42.92126 | 16.52126 |
| >1.0 | 17.42126 | 19.021126 | 38.82126 | 19.41063 | 45.42126 | 19.021126 |

EXAMPLE 2

TABLE III

| Distance from center (in.): | Pad size (mils): | "A" (mils): | "B" (mils): | "C" (mils): | "D" (mils): | "E" (mils): |
|---|---|---|---|---|---|---|
| 0–0.25 | 7.42126 | 10.27126 | 30.07126 | 15.03563 | 36.67126 | 10.27126 |
| 0.26–0.5 | 9.92126 | 10.27126 | 30.07126 | 15.03563 | 36.67126 | 10.27126 |
| 0.51–0.75 | 12.42126 | 15.27126 | 35.07126 | 17.53563 | 41.67126 | 15.27126 |
| 0.76–1.0 | 14.92126 | 15.27126 | 35.07126 | 17.53563 | 41.67126 | 15.27126 |
| >1.0 | 17.42126 | 15.27126 | 35.07126 | 17.53563 | 41.67126 | 15.27126 |

EXAMPLE 3

TABLE IV

| Distance from center (in.): | Pad size (mils): | "A" (mils): | "B" (mils): | "C" (mils): | "D" (mils): | "E" (mils): |
|---|---|---|---|---|---|---|
| 0–0.25 | 7.42126 | 12.77126 | 32.57126 | 16.28563 | 39.17126 | 12.77126 |
| 0.26–0.5 | 9.92126 | 12.77126 | 32.57126 | 16.28563 | 39.17126 | 12.77126 |
| 0.51–0.75 | 12.42126 | 12.77126 | 32.57126 | 16.28563 | 39.17126 | 12.77126 |
| 0.76–1.0 | 14.92126 | 17.77126 | 37.57126 | 18.78563 | 44.17126 | 17.77126 |
| >1.0 | 17.42126 | 17.77126 | 37.57126 | 18.78563 | 44.17126 | 17.77126 |

By way of explanation, and referring to Example 1 above (Table II), those signal pads in the second horizontal group of pads 3006 whose center point is located between 0 and 0.25 inches from center point 3019 would be generally square with sides of about 7.42126 mils in length. The vertical spacing (spacing "A") between the pads in such a column of signal pads (e.g., columns 3202, 3204, 3206, 3208, 3210) would be 9.02126 mils, and the horizontal spacing (spacing "D") between the column and the adjacent column moving away from center line 3018 would be 35.42126 mils.

Still referring to Example 1 above (Table II) but now referring to each signal pad in the second horizontal group of pads 3006 whose center point is located between 0.26 and 0.5 inches from center point 3019, those signal pads would be generally square with sides of about 9.92126 mils in length. The vertical spacing (spacing "A") between the pads in such a column of signal pads (e.g., columns 3202, 3204, 3206, 3208, 3210) would be 11.52126 mils, and the horizontal spacing (spacing "D") between the column and the adjacent column moving away from center line 3018 would be 37.92126 mils.

Pad size and "A" and "D" spacings for each signal pad in the second horizontal group of pads 3006 whose center point is displaced from the center point 3019 in one of the other ranges listed in Table II would be similarly size and spaced as specified in Table II.

Still referring to Example 1 above (Table II), but now referring to each signal pad in the third horizontal group of pads 3008, those signal pads whose center point is located between 0 and 0.25 inches from center point 3019 would be generally square with sides of about 7.42126 mils in length. If such a signal pad is in one of the four-pad columns (e.g., 3302, 3304, 3306, 3308, 3310 in FIG. 33), the vertical spacing between the pads in the column (spacing "A") would be 9.02126 mils, and the horizontal spacing (spacing "B") between the column and the adjacent column moving away from center line 3018 would be 28.82126 mils. If such a signal pad is one of the individual pads disposed between the four-pad columns (e.g., 3312, 3314, 3316, 3318 of FIG. 33), its "C" spacing would be 14.42063 mils.

Still referring to Example 1 above (Table II), each signal pad in the third horizontal group of pads 3008 whose center point is located between 0.26 and 0.5 inches from center point 3019 would be generally square with sides of about 9.92126 mils in length. If such a signal pad is in one of the four-pad columns (e.g., 3302, 3304, 3306, 3308, 3310 in FIG. 33), the vertical spacing between the pads in the column (spacing "A") would be 11.52126 mils, and the horizontal spacing (spacing "B") between the column and the adjacent column moving away from center line 3018 would be 31.32126 mils. If such a signal pad is one of the individual pads disposed between the four-pad columns (e.g., 3312, 3314, 3316, 3318 of FIG. 33), its "C" spacing would be 15.66063 mils.

Pad size and "A," "C," and "B" spacings for each signal pad in the third horizontal group of pads 3008 whose center point is displaced from the center point 3019 in one of the other ranges listed in Table II would be similarly size and spaced as specified in Table II.

Still referring to Example 1 above (Table II) but now referring to each signal pad in the forth horizontal group of pads 3010, those signal pads whose center point is located between 0 and 0.25 inches from center point 3019 would be generally square with sides of about 7.42126 mils in length. The horizontal spacing (spacing "E") between such a pad and the adjacent pad in the direction away from the center line 3018 would be 9.02126 mils. Still referring to Example 1 above (Table II) but now referring to each signal pad in the fourth horizontal group of pads 3010 whose center point is located between 0.26 and 0.5 inches from center line 3018, those signal pads would be generally square with sides of about 9.92126 mils in length. The horizontal spacing (spacing "E") between such a pad and the adjacent pad in the direction away from the center line 3018 would be 11.52126 mils.

Pad size and "E" spacing for each signal pad in the fourth horizontal group of pads 3010 whose center point is displaced from the center point 3019 in one of the other ranges listed in Table II would be similarly size and spaced as specified in Table II.

The size and spacing of pads in the fifth horizontal group of pads 3012 may be generally similar to that of the second horizontal group of pads 3006. The size and spacing of pads in the first and seventh horizontal groups of pads 3004, 3014 may be uniform, or may vary in accordance to one of the sizing and spacing schemes described above.

Figure 35:
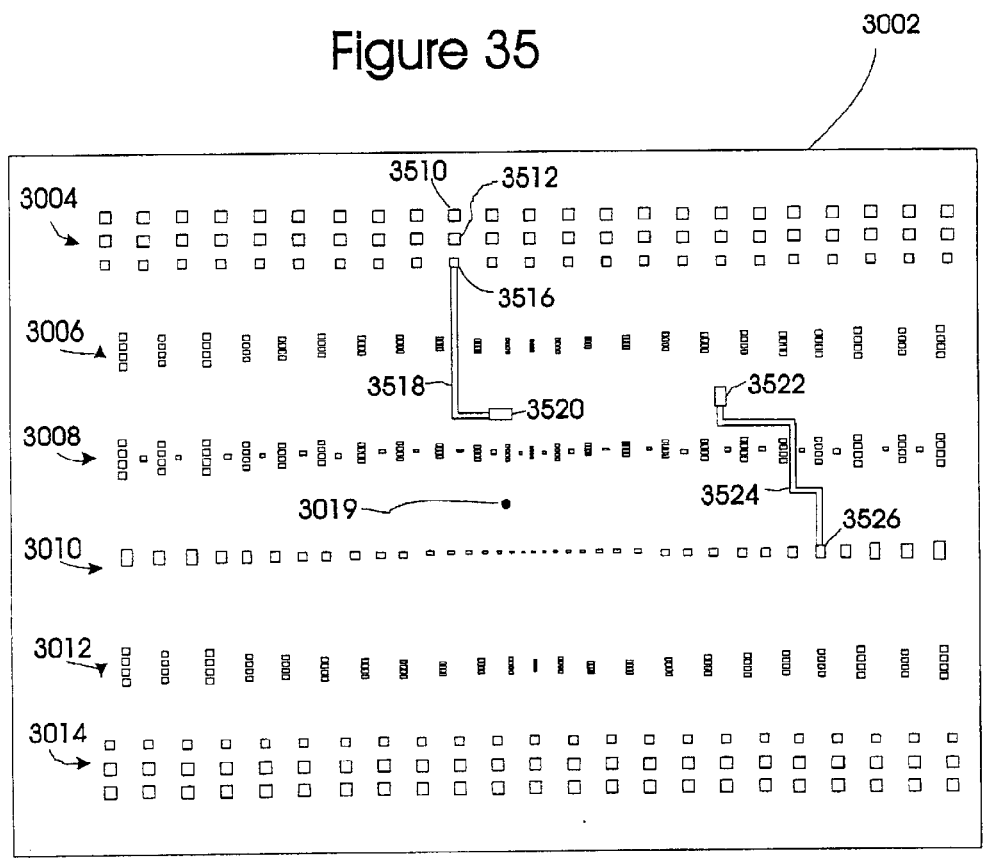
FIG. 35 illustrates adding customization to the exemplary probe head base of FIG. 30.

FIG. 35 illustrates an exemplary customization of the probe head base shown in FIGS. 30–34 (step 708 of FIG. 7). As shown in FIG. 35, a custom patterned layer of conductive material is selectively applied to the surface of substrate 3002. Generally speaking, the custom pattern layer comprises probe pads on which probes for contacting test points of the semiconductor device to be tested will be formed or placed. The custom pattern layer also includes traces electrically connecting the probe pads to either a power pad in one of either the first or sixth horizontal groups of pads 3004, 3014 or to a particular signal pad in one of the second through fifth horizontal groups of pads 3006, 3008, 3010, 3012.

FIG. 35 illustrates two exemplary probe pads 3520, 3522. As shown in FIG. 35, probe pad 3522 is connected through trace 3524 to a signal pad 3526 in the fourth horizontal group of pads 3010. As also shown in FIG. 35, probe pad 3520 is connected through trace 3518 to a power pad 3516 in the first horizontal group of pads 3004.

Although not shown in FIG. 35, additional probe pads are formed in locations corresponding to each test point on semiconductor device to be tested. Probes are then formed on the probe pads. The probes may be any type of probes, examples of which are discussed above. By-pass capacitors are attached to capacitor pads in the first and sixth horizontal groups of pads 3004, 3014. For example, a by-pass capacitor is attached to capacitor pads 3510 and 3512 to provide decoupling capacitance for the probe formed on or attached to probe pad 3520.

Once the custom conductive layer comprising probe pads and traces has been added to the probe base 3002 as described in the above example, the probe base 3002 may be subject to additional optional processing steps. Thereafter, the probe base 3002 may be joined to other elements (e.g., a printed circuit board 602 as shown in FIG. 8B, an interposer 1420, 1520 as shown in FIGS. 14 or 15, etc.) as generally described above with respect to step 710 in FIG. 7 and FIGS. 8A–15 to form a probe card assembly.

As should be apparent, although not show in the figures, a layer of insulating material may be formed over the custom conductive layer, and a second customer conductive layer formed over the insulating layer with conductive vias provided through the insulating layer to provide electrical connections between the first custom conductive layer and the second custom conductive layer. Indeed, several custom conductive layers may be formed, each separated by an insulating layer with conductive vias provided through the insulating layer for electrical connections between custom conductive layers. If more than one custom conductive layer is formed, pads for components (e.g., probe pads 3520, 3522) that are to be secured to an outer surface of the probe substrate 3002 would typically be formed on the outermost custom conductive layer. Circuit elements, such as resistors, capacitors, diodes, active electronic circuits, may of course be formed or embedded in one or more of the alternating layers of insulating and custom conductive layers.

It should be apparent that the specific pattern of pads illustrated in FIGS. 30–35 and the specific pad shape (square) as well as the variations in size and spacings described above and provided in Tables I through IV are exemplary only. Other patterns and pad shapes as well as variations in size and spacings may be utilized to form a prefabricated pattern of pads on a prefabricated substrate 3002 in which the size, locations and/or spacings of the pads vary in accordance with the distance of the pads from a point, line, or area on the substrate in order to ease the placement of probe pads and traces that compose a custom patterned layer applied to the substrate may be used.

Having thus described exemplary embodiments and applications of the invention, it should be apparent that various modifications, adaptations, and alternative embodiments and applications may be made within the scope and spirit of the invention. For example, conductive planes, pads, traces, etc. may be solid or formed of a mesh of conductive material. As another example, the orientation of the pattern of pads on the probe head substrate may be other than in the examples illustrated in the drawings. As just one example, the horizontal rows of pads 3004, 3006, 3008, 3010, 3012, 3014 shown in FIG. 30 may be oriented diagonally (rather than horizontally as shown in FIG. 30) with respect to the substrate 3002. The invention is intended to be limited only by the following claims.

What is claimed is:

1. A probe head comprising:
   a substrate having a first surface and an opposing second surface;
   a conductive plane embedded within said substrate;
   a plurality of terminals disposed on said first surface, said terminals being electrically insulated one from another;
   a plurality of signal pads disposed on said second surface, said signal pads being electrically insulated one from another;
   a plurality of electrically conductive paths, each said path connecting one of said terminals with one of said signal pads, said conductive paths being electrically insulated one from another; and
   a conductive area disposed on said second surface between ones of said signal pads and electrically connected to said conductive plane, said conductive area being electrically insulated from said plurality of signal pads.

2. The probe head of claim 1 wherein said conductive area comprises a conductive plane.

3. The probe head of claim 2, wherein said conductive plane comprises a plurality of openings in which are disposed said plurality of signal pads.

4. The probe head of claim 3, wherein each said opening provides a space between said signal pad disposed therein and said conductive plane in a range of 2 to 20 mils.

5. The probe head of claim 2, wherein said plurality of signal pads are disposed in a two-dimensional array.

6. The probe head of claim 5, wherein said plurality of signal pads are disposed at a pitch in a range of 20 to 100 mils.

7. The probe head of claim 1, wherein said conductive area comprises a plurality of ground pads.

8. The probe head of claim 7, wherein at least one signal pad is disposed between each of said plurality of ground pads.

9. The probe head of claim 7, wherein said plurality of signal pads are disposed in a two-dimensional array.

10. The probe head of claim 9, wherein adjacent signal pads are spaced from each other in a range of 2 to 15 mils.

11. The probe head of claim 9, wherein said plurality of signal pads are disposed at a pitch in a range of 15 to 50 mils.

12. The probe head of claim 7, wherein said plurality of signal pads and said plurality of ground pads are disposed on said second surface of said substrate in a pattern comprising:
   a subpattern comprising a ground pad disposed between at least two signal pads; and
   a two-dimensional array of said subpattern.

13. The probe head of claim 12, wherein said subpattern comprises a ground pad disposed between four signal pads.

14. A method of making a probe card assembly comprising:
   providing a first component of said probe card assembly as a premanufactured component, said first component comprising a substrate and a first patterned conductive layer on a first surface of said substrate, said first patterned conductive layer comprising:
      a plurality of signal pads electrically connected to a plurality of terminals disposed on a second surface of said substrate, and
      a conductive area electrically connected to a conductive plane embedded within said substrate, said plurality of signal pads being electrically insulated from said conductive area and said embedded plane;
   thereafter receiving design data regarding a semiconductor device to be tested by said probe card assembly, said design data including locations of test points on said semiconductor device,
   forming a plurality of contact element pads on said first electronic component disposed to correspond to said locations of said test points on said semiconductor device and electrically connected to a first subset of said signal pads;
   electrically connecting a signal pad from a second set of said signal pads to said conductive area; and
   adding a plurality of contact elements for contacting said test points on said semiconductor device to said plurality of contact element pads.

15. The method of claim 14, wherein said conductive area comprises a ground plane.

16. The method of claim 15, wherein said ground plane comprises a plurality of openings in which are disposed said plurality of signal pads.

17. The method of claim 14, wherein said conductive area comprises a plurality of ground pads.

18. The method of claim 14 further comprising:
   forming a plurality of electronic component pads on said first electronic component; and
   disposing at least one electronic component on said plurality of pads.

19. The method of claim 18, wherein said at least one electronic component is a capacitor.

20. The method of claim 14 further comprising electrically connecting a plurality of signal pads from said second set of said signal pads to said conductive area.

21. The method of claim 14, wherein at least one of said test points protrudes from a surface of said semiconductor device, and said plurality of contact elements includes at least one corresponding contact element configured to contact said protruding test point.

22. The method of claim 21, wherein said at least one corresponding contact element is selected from a group consisting of a pad, a recess, and a socket.

23. The method of claim 14 further comprising combining said first component with at least one other component to form said probe card assembly.

24. The method of claim 23, wherein said at least one other component is one of a printed circuit board configured to make electrical connections with a semiconductor tester, an interposer, and an interface with a cable from a semiconductor tester.

25. The method of claim 14 further comprising forming an insulating layer over said first patterned conductive layer, and forming said plurality of contact element pads on said insulating layer.

* * * * *